(12) United States Patent
Micheloni et al.

(10) Patent No.: US 9,128,858 B1
(45) Date of Patent: Sep. 8, 2015

(54) APPARATUS AND METHOD FOR ADJUSTING A CORRECTABLE RAW BIT ERROR RATE LIMIT IN A MEMORY SYSTEM USING STRONG LOG-LIKELIHOOD (LLR) VALUES

(71) Applicant: PMC-SIERRA US, INC., Sunnyvale, CA (US)

(72) Inventors: Rino Micheloni, Turate (IT); Peter Z. Onufryk, Flanders, NJ (US); Alessia Marelli, Dalmine (IT); Christopher I. W. Norrie, San Jose, CA (US); Ihab Jaser, San Jose, CA (US)

(73) Assignee: PMC-SIERRA US, INC., Sunnyvale, CA (US)

( * ) Notice: Subject to any disclaimer, the term of this patent is extended or adjusted under 35 U.S.C. 154(b) by 85 days.

(21) Appl. No.: 13/752,757

(22) Filed: Jan. 29, 2013

(51) Int. Cl.
*G11C 29/00* (2006.01)
*G06F 11/10* (2006.01)

(52) U.S. Cl.
CPC ...................... *G06F 11/10* (2013.01)

(58) Field of Classification Search
CPC ............ G06F 11/1076; G06F 11/1008; G06F 11/1068; G06F 11/1044; H05K 999/99
USPC ........................................................ 714/763
See application file for complete search history.

(56) References Cited

U.S. PATENT DOCUMENTS

| | | | |
|---|---|---|---|
| 5,732,092 A | 3/1998 | Shinohara | |
| 6,115,788 A | 9/2000 | Thowe | |
| 6,539,515 B1 | 3/2003 | Gong | |
| 6,934,804 B2 | 8/2005 | Hashemi | |
| 6,976,194 B2 | 12/2005 | Cypher | |
| 6,976,197 B2 | 12/2005 | Faust et al. | |
| 7,206,992 B2 | 4/2007 | Xin | |
| 7,237,183 B2 | 6/2007 | Xin | |
| 7,484,158 B2 | 1/2009 | Sharon et al. | |
| 7,937,641 B2 | 5/2011 | Amidi | |
| 7,958,430 B1 | 6/2011 | Kolokowsky et al. | |
| 7,975,193 B2 | 7/2011 | Johnson | |
| 8,140,930 B1 | 3/2012 | Maruo | |
| 8,176,367 B2 | 5/2012 | Dreifus et al. | |
| 8,219,894 B2 | 7/2012 | Au et al. | |
| 8,245,112 B2 | 8/2012 | Hicken et al. | |
| 8,245,117 B1 | 8/2012 | Wu | |
| 8,255,770 B2 | 8/2012 | Park et al. | |
| 8,261,136 B2 | 9/2012 | D'abreu et al. | |
| 8,281,227 B2 | 10/2012 | Thatcher et al. | |
| 8,286,004 B2 | 10/2012 | Williams | |
| 8,307,258 B2 | 11/2012 | Flynn et al. | |
| 8,327,220 B2 | 12/2012 | Borchers et al. | |
| 8,335,977 B2 | 12/2012 | Weingarten et al. | |
| 8,359,522 B2 | 1/2013 | Gunnam et al. | |

(Continued)

*Primary Examiner* — Albert Decady
*Assistant Examiner* — Enam Ahmed
(74) *Attorney, Agent, or Firm* — Glass & Associates; Kenneth Glass; Mark Peloquin

(57) ABSTRACT

Apparatuses and methods for correcting errors in data read from memory cells of an integrated circuit device includes an encoder. The encoder is configured from a single parity check matrix and the encoder is configured to be virtually adjustable by setting a number of bits in the encoder to zero. A decoder is configured from the single parity check matrix and the decoder is configured to be virtually adjustable by setting a log-likelihood ratio (LLR) for a number of bits in the decoder to a strong value. A code-rate that the encoder and decoder uses can be changed by adjusting the number of bits in the encoder that are set to zero and the number of bits in the decoder that are set to the strong LLR value.

27 Claims, 19 Drawing Sheets

(56) References Cited

U.S. PATENT DOCUMENTS

| | | |
|---|---|---|
| 8,392,789 B2 | 3/2013 | Biscondi et al. |
| 8,402,201 B2 | 3/2013 | Flynn et al. |
| 8,418,023 B2 | 4/2013 | Gunnam et al. |
| 8,429,497 B2 | 4/2013 | Tu et al. |
| 8,504,887 B1 | 8/2013 | Varnica et al. |
| 8,621,318 B1 | 12/2013 | Micheloni et al. |
| 8,640,005 B2 * | 1/2014 | Wilkerson et al. ............ 714/763 |
| 8,656,257 B1 | 2/2014 | Micheloni et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 2003/0033567 A1 | 2/2003 | Tamura et al. |
| 2003/0104788 A1 | 6/2003 | Kim |
| 2004/0088636 A1 | 5/2004 | Cypher |
| 2004/0123230 A1 | 6/2004 | Lee et al. |
| 2004/0234150 A1 * | 11/2004 | Chang ........................... 382/251 |
| 2004/0252791 A1 | 12/2004 | Shen et al. |
| 2005/0248999 A1 | 11/2005 | Tamura et al. |
| 2006/0126728 A1 * | 6/2006 | Yu et al. ................... 375/240.03 |
| 2007/0050688 A1 | 3/2007 | Thayer |
| 2007/0089031 A1 | 4/2007 | Hufman et al. |
| 2008/0005382 A1 | 1/2008 | Mimatsu |
| 2008/0016425 A1 * | 1/2008 | Khan et al. .................... 714/755 |
| 2008/0229079 A1 | 9/2008 | Flynn et al. |
| 2008/0229164 A1 | 9/2008 | Tamura et al. |
| 2008/0256292 A1 | 10/2008 | Flynn et al. |
| 2009/0327802 A1 | 12/2009 | Fukutomi |
| 2010/0199149 A1 | 8/2010 | Weingarten et al. |
| 2010/0211737 A1 | 8/2010 | Flynn et al. |
| 2010/0211852 A1 | 8/2010 | Lee et al. |
| 2010/0246664 A1 * | 9/2010 | Citta et al. ............... 375/240.01 |
| 2010/0293440 A1 | 11/2010 | Thatcher et al. |
| 2011/0072331 A1 | 3/2011 | Sakaue et al. |
| 2011/0119553 A1 * | 5/2011 | Gunnam et al. .............. 714/752 |
| 2011/0246853 A1 | 10/2011 | Kim |
| 2011/0296084 A1 | 12/2011 | Nango |
| 2012/0051144 A1 | 3/2012 | Weingarten et al. |
| 2012/0054413 A1 | 3/2012 | Brandt |
| 2012/0311402 A1 | 12/2012 | Tseng et al. |
| 2013/0086451 A1 * | 4/2013 | Grube et al. .................. 714/763 |
| 2013/0145235 A1 | 6/2013 | Aussien et al. |
| 2013/0163328 A1 | 6/2013 | Karakulak et al. |
| 2014/0053037 A1 | 2/2014 | Wang et al. |
| 2014/0072056 A1 * | 3/2014 | Fay .......................... 375/240.25 |

\* cited by examiner

FIG 10A

| ECC CHUNK PROTECTED DATA | ECC ChunkNum Circulants | ECC Chunk Total Size | ECC Chunk Size | ECC Native Code Rate | ECC Chunks per Flash Page | Flash Protected Data |
|---|---|---|---|---|---|---|
| 60 | 1 | 5 | 320 | 0.19 | 28 | 1680 |
| 124 | 2 | 6 | 384 | 0.32 | 24 | 2976 |
| 188 | 3 | 7 | 448 | 0.42 | 20 | 3760 |
| 252 | 4 | 8 | 512 | 0.49 | 18 | 4536 |
| 316 | 5 | 9 | 576 | 0.55 | 16 | 5056 |
| 380 | 6 | 10 | 640 | 0.59 | 14 | 5320 |
| 444 | 7 | 11 | 704 | 0.63 | 13 | 5772 |
| 508 | 8 | 12 | 768 | 0.66 | 12 | 6096 |
| 572 | 9 | 13 | 832 | 0.69 | 11 | 6292 |
| 636 | 10 | 14 | 896 | 0.71 | 10 | 6360 |
| 700 | 11 | 15 | 960 | 0.73 | 9 | 6300 |
| 764 | 12 | 16 | 1024 | 0.75 | 9 | 6876 |
| 828 | 13 | 17 | 1088 | 0.76 | 8 | 6624 |
| 892 | 14 | 18 | 1152 | 0.77 | 8 | 7136 |
| 956 | 15 | 19 | 1216 | 0.79 | 7 | 6692 |
| 1020 | 16 | 20 | 1280 | 0.80 | 7 | 7140 |
| 1084 | 17 | 21 | 1344 | 0.81 | 6 | 6504 |
| 1148 | 18 | 22 | 1408 | 0.82 | 6 | 6888 |
| 1212 | 19 | 23 | 1472 | 0.82 | 6 | 7272 |
| 1276 | 20 | 24 | 1536 | 0.83 | 6 | 7656 |
| 1340 | 21 | 25 | 1600 | 0.84 | 5 | 6700 |
| 1404 | 22 | 26 | 1664 | 0.84 | 5 | 7020 |

FIG 10C

| ECC CHUNK PROTECTED DATA | ECC ChunkNum Circulants | ECC Chunk Total Size | ECC Chunk Size | ECC Native Code Rate | ECC Chunks per Flash Page | Flash Protected Data |
|---|---|---|---|---|---|---|
| 2876 | 45 | 49 | 3136 | 0.92 | 2 | 5752 |
| 2940 | 46 | 50 | 3200 | 0.92 | 2 | 5880 |
| 3004 | 47 | 51 | 3264 | 0.92 | 2 | 6008 |
| 3068 | 48 | 52 | 3328 | 0.92 | 2 | 6136 |
| 3132 | 49 | 53 | 3392 | 0.92 | 2 | 6264 |
| 3196 | 50 | 54 | 3456 | 0.92 | 2 | 6392 |
| 3260 | 51 | 55 | 3520 | 0.92 | 2 | 6520 |
| 3324 | 52 | 56 | 3584 | 0.93 | 2 | 6648 |
| 3388 | 53 | 57 | 3648 | 0.93 | 2 | 6776 |
| 3452 | 54 | 58 | 3712 | 0.93 | 2 | 6904 |
| 3516 | 55 | 59 | 3776 | 0.93 | 2 | 7032 |
| 3580 | 56 | 60 | 3840 | 0.93 | 2 | 7160 |
| 3644 | 57 | 61 | 3904 | 0.93 | 2 | 7288 |
| 3708 | 58 | 62 | 3968 | 0.93 | 2 | 7416 |
| 3772 | 59 | 63 | 4032 | 0.94 | 2 | 7544 |
| 3836 | 60 | 64 | 4096 | 0.94 | 2 | 7672 |
| 3900 | 61 | 65 | 4160 | 0.94 | 2 | 7800 |
| 3964 | 62 | 66 | 4224 | 0.94 | 2 | 7928 |
| 4028 | 63 | 67 | 4288 | 0.94 | 2 | 8056 |
| 4092 | 64 | 68 | 4352 | 0.94 | 2 | 8184 |
| 4156 | 65 | 69 | 4416 | 0.94 | 2 | 8312 |
| 4220 | 66 | 70 | 4480 | 0.94 | 2 | 8440 |
| 4284 | 67 | 71 | 4544 | 0.94 | 2 | 8568 |

APPARATUS AND METHOD FOR ADJUSTING A CORRECTABLE RAW BIT ERROR RATE LIMIT IN A MEMORY SYSTEM USING STRONG LOG-LIKELIHOOD (LLR) VALUES

BACKGROUND OF THE INVENTION

Writing data, erasing data and reading data to and from memory cells can introduce noise into the process which will result in errors in the data read from the memory cells. To ensure that the data is error free following a read operation, error correction techniques are employed. For example, error correction codes (ECC) are used to encode the data before it is written to the memory cells and then the encoded data are decoded following the read operation. Codes used to correct more than one error in data are, for example, Reed-Solomon and Bose-Chaudhuri-Hochquenghem (BCH). These codes have limited error correction capability when the number of errors increases. This has presented a problem.

A variety of semiconductor manufacturing techniques and circuit designs are used to make memory cells. NAND and NOR flash memory are used in a wide variety of applications that require memory cells. The desire for denser and denser memory cell structures (to increase storage capacity) drives feature size reduction during memory cell development. In addition, memory cells which can store more than a single bit of information are increasingly used, i.e., a multi-level cell (MLC and TLC). In the case of NAND flash memory, a MOSFET is made with a floating gate transistor as a component of a memory cell. During a write operation, a certain amount of charge is injected into the floating gate, placing the floating gate at a specific voltage. The floating gate affects the electric field from the control gate, which modifies the threshold voltage of the cell. If the threshold voltage is not stable over time, errors can occur during read operations. Voltage fluctuations (noise) on the power rails can also contribute to errors. This can present a problem.

Error correction solutions, even when implemented in a combination of hardware and software, often require specific hardware that is designed for the particular error correcting solution selected. Hardware constraints such as this limit the flexibility of a design. A new design and new hardware are needed when the design criteria (use case) changes. For example, some designs require minimum memory access times, while other designs require a minimum of space on the chip devoted to the error correction function. Resources (time and money) must be expended to implement a new error correction solution for each use case or to include separate on chip hardware for multiple use cases in a single memory controller. This can present a problem.

Various mechanisms create damage to the memory cells, which accumulates over time as the number of program/erase cycles increases. In the case of NAND flash memory, program/erase cycles can cause damage to the tunnel oxide of the floating gate which results in a shift of the threshold voltage of the memory cell. Additionally, the threshold voltage shift of one memory cell can influence the threshold voltage of its neighboring cells through parasitic capacitive-coupling effects, referred to as cell-to-cell interference. These effects which change the value of the data read from the cell relative to what was written are referred to as errors. If the number of read errors increases as the device ages, beyond that which can be corrected by the ECC, the integrity of the data is lost. All of this presents a host of problems.

SUMMARY

In various embodiments, an integrated circuit device for correcting errors in data read from memory cells includes an encoder and a decoder. The encoder is configured from a single parity check matrix. The encoder is configured to be virtually adjustable by setting a number of bits in the encoder to zero. The decoder is configured from the single parity check matrix. In various embodiments, the decoder is configured to be virtually adjustable by setting a log-likelihood ratio (LLR) for a number of bits in the decoder to a strong value. A code-rate that the encoder and decoder uses is changed by adjusting the number of bits in the encoder that are set to zero and the number of bits in the decoder that are set to the strong LLR value.

In some embodiments, the integrated circuit device includes a data management module. The data management module is connected with the decoder and the encoder. The data management module is configured to select a correctable raw bit error rate limit from a plurality of raw bit error rate limits by changing the code-rate.

In one or more embodiments, the integrated circuit device includes a communication link. The communication link connects the encoder and the decoder. Information on a number of errors occurring during decode cause a code-rate adjustment.

In various embodiments, the strong LLR value for the bits set in the decoder is a value that is strongly resistant to change, or it is a value that is fixed during the decoding, or it can be a guard value. In one or more embodiments, the number of bits set to zero in the encoder can be a fraction of a processing engine width or a multiple of a processing engine width. The number of bits set to a strong LLR value in the decoder can be a fraction of a processing engine width or a multiple of a processing engine width.

In various embodiments, a code used to develop the single parity check matrix can be a user specified error correcting code, a Reed-Solomon code, a Bose-Chaudhuri-Hochquenghem (BCH) code, a quasi-cyclic low density parity check code (QC-LDPC), an irregular repeat-accumulate (IRA) code, a code from projective geometry, or a user defined quasi-cyclic code.

In different embodiments, a memory cell can be a NAND memory cell, a NOR memory cell, or a user defined memory cell. The memory cell can be a single-level cell, a triple-level cell, or a multi-level cell.

In some embodiments, the code-rate is changed when a number of bits corrected by the decoder cross a threshold and the threshold is less than the correctable raw bit error rate limit of a code at the current code-rate. The threshold prevents a potential decoding failure by maintaining the number of bits corrected by the decoder at a level below the correctable raw bit error rate limit. In some embodiments, the integrated circuit device includes RAID architecture. The RAID architecture is used to recover data if the data fails to decode successfully.

In various embodiments, a method for correcting errors in data read from memory cells includes making a virtual adjustment to an encoder. The encoder is configured from a single parity check matrix and a number of bits in the encoder are set to zero. Data is encoded while using the number of bits set to zero to virtually reduce a dimension of the encoder, thus establishing a code-rate. A command is received to change the code-rate from a first code-rate to a second code-rate. Data is encoded at the second code-rate in response to the command. In one embodiments, the command to change the code-rate is based on information that occurred during a previous decode operation performed by a decoder. The information includes a number of bits corrected during the previous decode operation. In some embodiments, a RAID function is used to recover data following a decode failure.

In different embodiments, a method for correcting errors in data read from memory cells includes making a virtual adjustment to a decoder. The decoder is configured from a single parity check matrix. A strong log-likelihood ratio (LLR) value is assigned to a number of bits in the decoder. Data are decoded while using the strong LLR value for the number of bits. The strong LLR value changes a code-rate used during the decoding by virtually adjusting a column dimension of the single parity check matrix.

In some embodiments, a command is sent to change a code-rate used to encode data from a first code-rate to a second code-rate. Data is encoded at the second code-rate in response to the command. The command to change code-rate is based on information that occurred during the decoding. In one embodiment, the information includes a number of bits corrected during the decoding.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 10A illustrates parameters for a QC-LDPC code, according to embodiments of the invention.

FIG. 10C is a continuation of the table of FIG. 10A.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

Apparatuses and methods are described for adjusting a raw bit error rate limit for error correction of data in memory systems. Such functionality permits a single error correction hardware/software implementation to be used for a plurality of use cases. For example, an error correction system that minimizes hardware usage for error correction and one that maintains a high decoding speed can be obtained from the same encoder/decoder hardware design using various embodiments of the invention.

Figure 1:
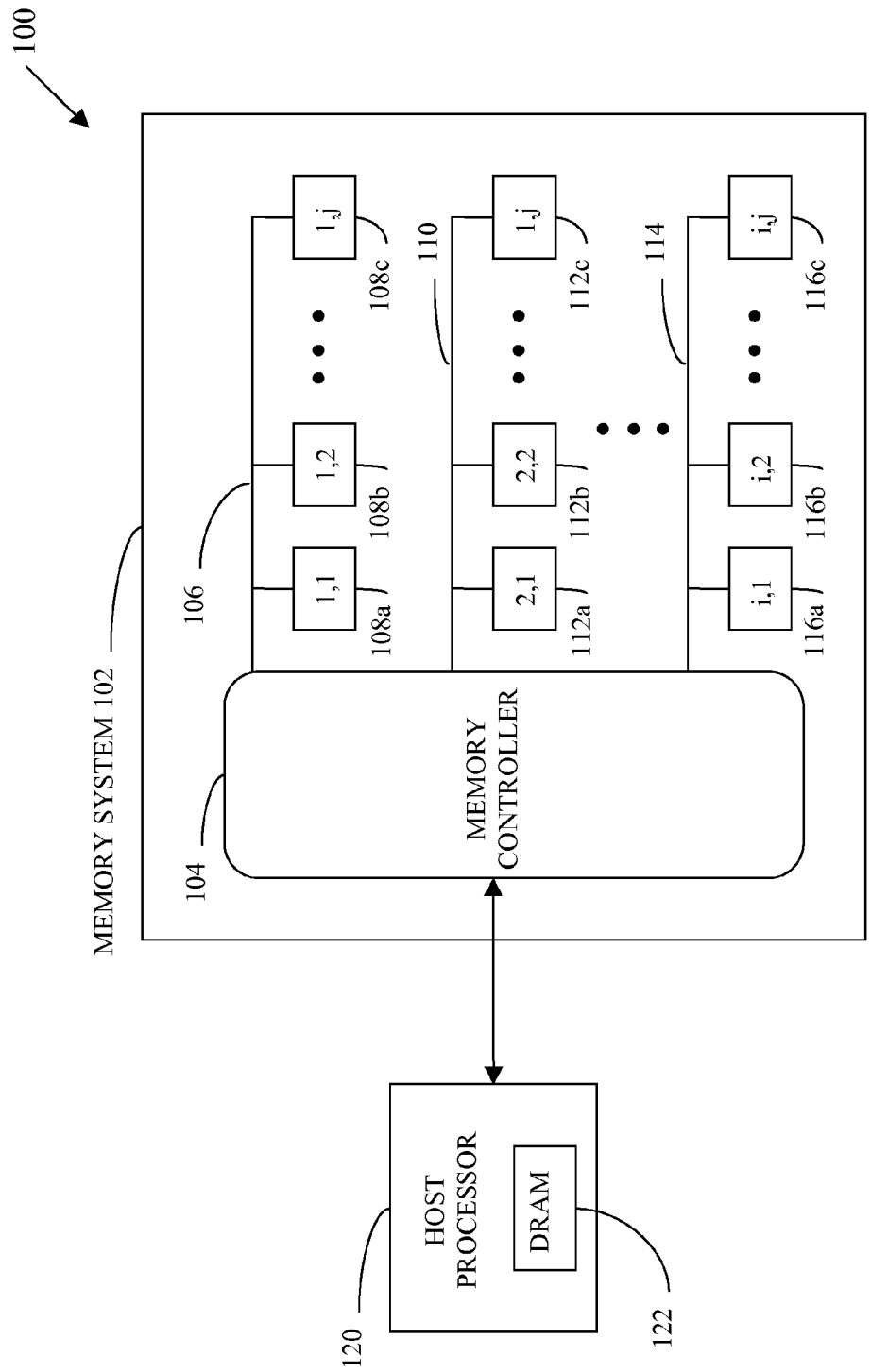
FIG. 1 illustrates a block diagram of a memory system, according to embodiments of the invention.

FIG. 1 illustrates, generally at 100, a block diagram of a memory system, according to embodiments of the invention. With reference to FIG. 1, a memory system 102 includes a memory controller 104. The memory controller 104 is coupled to a number of memory cells. In various embodiments, the memory cells are configured into a general number of channels, represented by the letter "i." For example, 106 represents a first channel of memory. The first channel 106 includes a general number, represented by the letter "j," of memory chips 108a, 108b, through 108c. Similarly, 110 represents a second channel of memory. The second channel 110 includes a general number, represented by the letter "j," of memory chips 112a, 112b, through 112c. 114 represents the $i^{th}$ channel of memory with memory chips 116a, 116b, through 116c. Each of the memory chips 108a, 108b, through 108c, 112a, 112b, through 112c, 116a, 116b, through 116c contains a plurality of memory cells.

In various embodiments, the memory system 102 is known in the art as flash memory. The memory system 102 can be configured as a solid state disk (SSD) or implemented as removable memory commonly referred to as a thumb drive or a memory stick. Each memory chip, such as 108a, includes a plurality of individual memory cells. In one embodiment, a non-limiting example of a solid state disk (SSD) is made using 512 NAND chips. The 512 NAND chips are configured 16 to a channel with a total of 32 channels for a nominal capacity of 1 Terabyte (TByte) of storage. Other configurations of chip size, number of chips, and number of channels can be configured depending on the particulars of the use case. Embodiments of the invention are not limited by the size of the memory system selected for a given use case. In the example above, NAND chips were used. Alternatively, NOR memory can be used in place of NAND memory. Embodiments of the invention are not limited by the particular technology or circuit design underlying a memory cell. Embodiments of the invention can be used with user defined memory cells and with memory cells that are yet to be invented.

The memory controller 104 is coupled to a host processor 120. Host processor 120 includes dynamically accessible memory indicated by DRAM 122. In various embodiments, the host processor can reside in a variety of devices such as a computer of any type, e.g., stationary, desk top, tablet, notebook, etc. In other embodiments the memory system 102 can be used with various portable devices such as mobile phones, digital cameras, digital video cameras, global position systems, audio/visual media devices as well as devices yet to be invented. Embodiments of the invention are not limited by the purpose or name of the device in which the memory is used.

In various embodiments, the memory controller 104 may include one or more hardware components, one or more software components, or some combination thereof. Examples of hardware components include but are not limited to a combinational logic circuit, a sequential logic circuit, a microprocessor, an embedded processor, an embedded controller or the like. Examples of software components include but are not limited to a computing program, computing instructions, a software routine, e.g. firm-ware or the like.

In various embodiments, the memory system 102 is implemented in an integrated circuit device, which may include an integrated circuit package containing the integrated circuit. In some embodiments, the memory system 102 is implemented in a single integrated circuit die. In other embodiments, the memory system 102 is implemented in more than one integrated circuit die of an integrated circuit device which may include a multi-chip package containing the integrated circuit.

Figure 2:
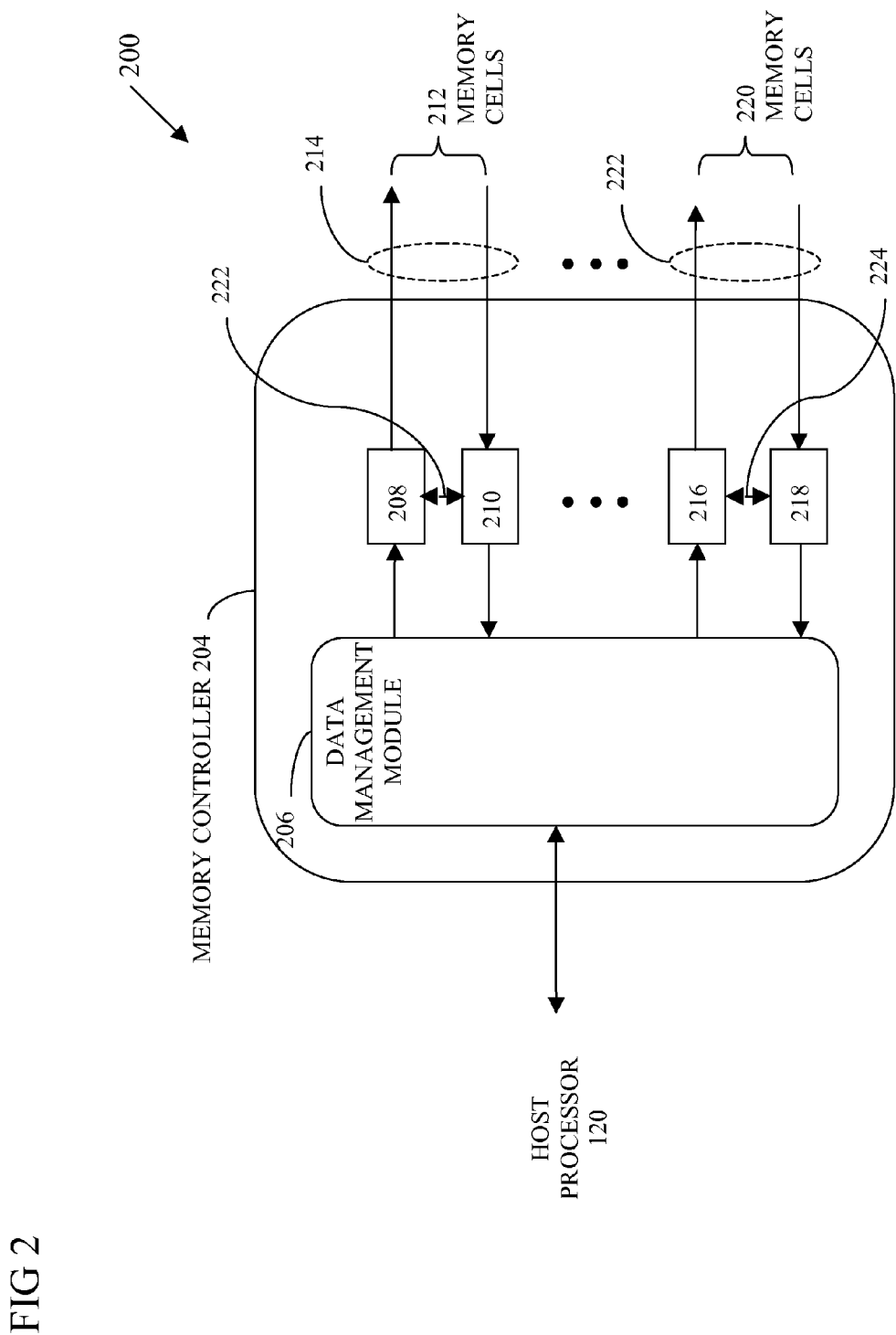
FIG. 2 illustrates an exploded view of a memory controller, according to embodiments of the invention.

FIG. 2 illustrates, generally at 200, an exploded view of a memory controller, according to embodiments of the invention. With reference to FIG. 2, a memory controller 204 contains a data management module 206. The data management module 206 is coupled to an encoder 208 and a decoder 210. The encoder 208 and the decoder 210 are coupled to a first channel of memory cells indicated at 212 by a data communication path 214. In various embodiments, the first channel of memory cells 212 is equivalent to the first channel of memory 106 (FIG. 1). The memory management module 206 is coupled to a host processor 120. Depending on the size of memory system additional encoder/decoder pairs are coupled to the data management module 206. A general number of encoder/decoder pairs is indicated by an encoder 216 and a decoder 218. The encoder 216 and decoder 218 are coupled to memory cells 220 by a data communication path 222. In various embodiments, the encoder 216 and the decoder 218 are equivalent to the "$i^{th}$" channel 114 (FIG. 1). Optionally, the encoder 208 and the decoder 210 are coupled together by communication link 224 to facilitate passing information there between. Similarly, the other encoders such as 216 are coupled to the corresponding decoder 218 of the given channel by communication link 226 to facilitate passing information there between.

In various embodiments, the data management module 206, encoder 208, decoder 210, communication channel 222, through encoder 216, decoder 218, and communication channel 224 may include one or more hardware components, one or more software components, or some combination thereof. Examples of hardware components include but are not limited to a combinational logic circuit, a sequential logic circuit, a microprocessor, an embedded processor, an embedded controller or the like. Examples of software components include but are not limited to a computing program, computing instructions, a software routine, e.g. firm-ware or the like.

In various embodiments, the data management module 206 is implemented in an integrated circuit device, which may include an integrated circuit package containing the integrated circuit. In some embodiments, the data management module 206 is implemented in a single integrated circuit die. In other embodiments, the data management module 206 is implemented in more than one integrated circuit die of an integrated circuit device which may include a multi-chip package containing the integrated circuit.

In various embodiments, the encoder 208 is implemented in an integrated circuit device, which may include an integrated circuit package containing the integrated circuit. In some embodiments, the encoder 208 is implemented in a single integrated circuit die. In other embodiments, the encoder 208 is implemented in more than one integrated circuit die of an integrated circuit device which may include a multi-chip package containing the integrated circuit.

In various embodiments, the decoder 210 is implemented in an integrated circuit device, which may include an integrated circuit package containing the integrated circuit. In some embodiments, the decoder 210 is implemented in a single integrated circuit die. In other embodiments, the decoder 210 is implemented in more than one integrated circuit die of an integrated circuit device which may include a multi-chip package containing the integrated circuit.

In various embodiments, the encoder 216 is implemented in an integrated circuit device, which may include an integrated circuit package containing the integrated circuit. In some embodiments, the encoder 216 is implemented in a single integrated circuit die. In other embodiments, the encoder 216 is implemented in more than one integrated circuit die of an integrated circuit device which may include a multi-chip package containing the integrated circuit.

In various embodiments, the decoder 218 is implemented in an integrated circuit device, which may include an integrated circuit package containing the integrated circuit. In some embodiments, the decoder 218 is implemented in a single integrated circuit die. In other embodiments, the decoder 218 is implemented in more than one integrated circuit die of an integrated circuit device which may include a multi-chip package containing the integrated circuit.

The host processor 120 issues write and read commands to the memory system 102 (FIG. 1), which result in data being written to the memory cells during a write command and then read from the memory cells during a read command. The possibility of the data being changed by the environment can result in the introduction of undesirable errors, thus changing a value of a bit from an intended value to an unintended value. Such undesirable errors can be introduced by any type of memory cell that is placed in communication with the memory controller 204 via 212 and 220. In one non-limiting example, embodiments of the invention are used to correct errors in NAND flash memory.

Figure 3:
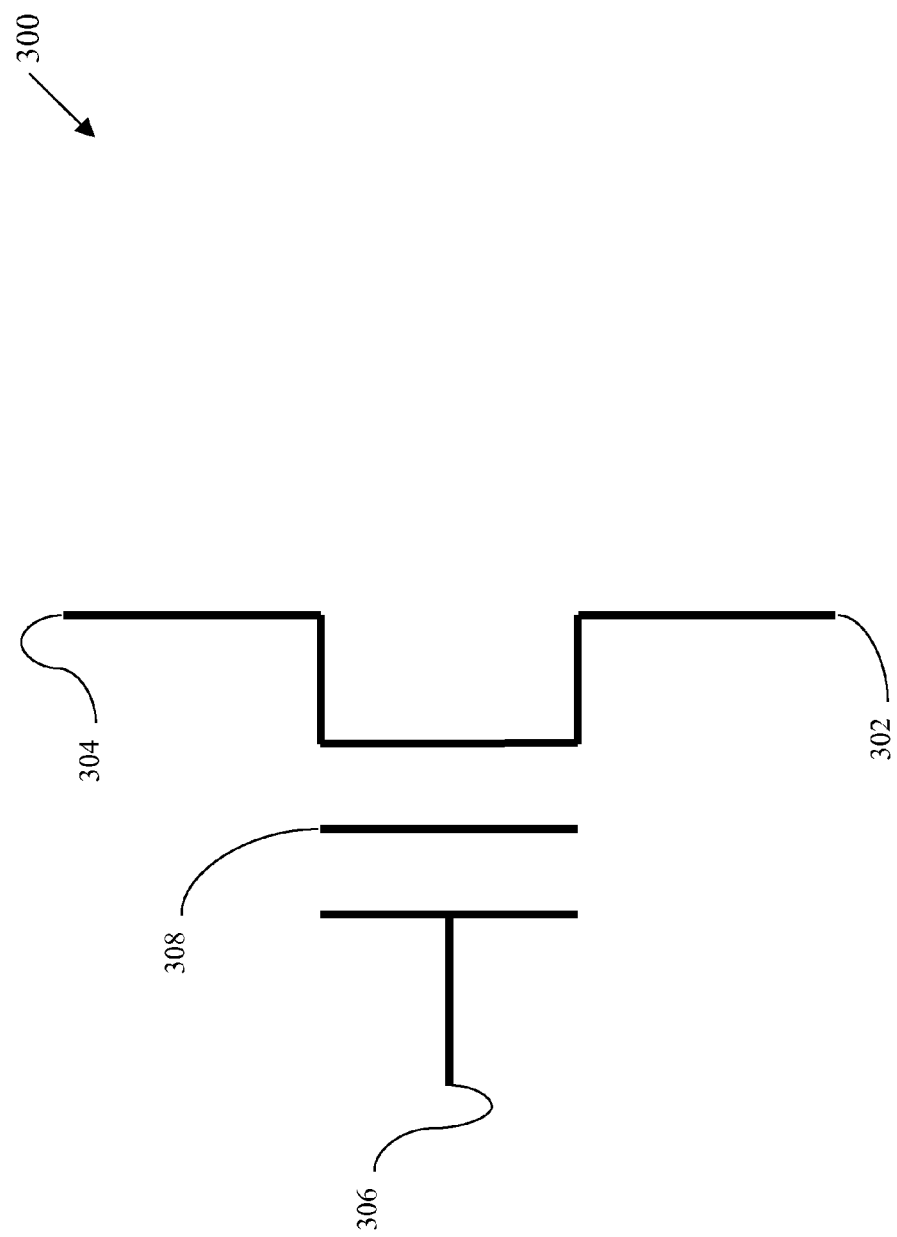
FIG. 3 illustrates a portion of a NAND memory element, according to embodiments of the invention.

FIG. 3 illustrates, generally at 300, a portion of a NAND memory element, according to embodiments of the invention. With reference to FIG. 3, a NAND flash memory cell is made using a floating gate transistor. The floating gate transistor has two overlapping gates, a floating gate 308 and a control gate 306. A source is indicated at 302 and a drain is indicated at 304. The floating gate 308 is surrounded by oxide, which traps any electrons which have been injected into the floating gate 308. The stability of the charge held on the floating gate influences whether an error will occur during write and or read operations to a memory cell made with the floating gate transistor as shown in FIG. 3.

NAND memory elements using the floating gate transistor 300 can be configured to store one or more bits of information. A NAND memory cell configured to store one bit of information is referred to as a single level cell (SLC). A NAND memory cell configured to store two bits of information is referred to as a multi-level cell (MLC), a cell configured to store three bits of information is referred as triple level cells (TLC). Such multi-level cell construction is obtained by allowing for multiple levels of electrical charge to be applied to the floating gate. Data density in MLC memory cell designs increase the probability of errors occurring during write/read operations. Embodiments of the invention are used to remove the errors from the data read from NAND memory cells using all constructions, i.e., SLC, MLC, and TLC.

Equivalently, NOR flash memory can be used in place of the NAND flash memory cells. Embodiments of the invention can be applied to correct errors occurring in the write/read of data from memory cells made using NOR flash memory. Embodiments of the invention are not limited by the type of memory cell used in the memory system 102 of FIG. 1. Those of skill in the art will recognize that other memory cells can be used with embodiments of the invention and that embodiments of the invention are not limited by the type of memory cell used. Those of skill in the art will also realize that embodiments of the invention can be used with non-volatile memory cells (e.g., flash memory) described herein or with volatile memory such as dynamic random access memory (DRAM). In light of the ever present probability of data becoming corrupted while resident in memory, an error correction code is used to enable the errors to be removed and the original data to be retrieved from the memory following the read operation.

Figure 4:
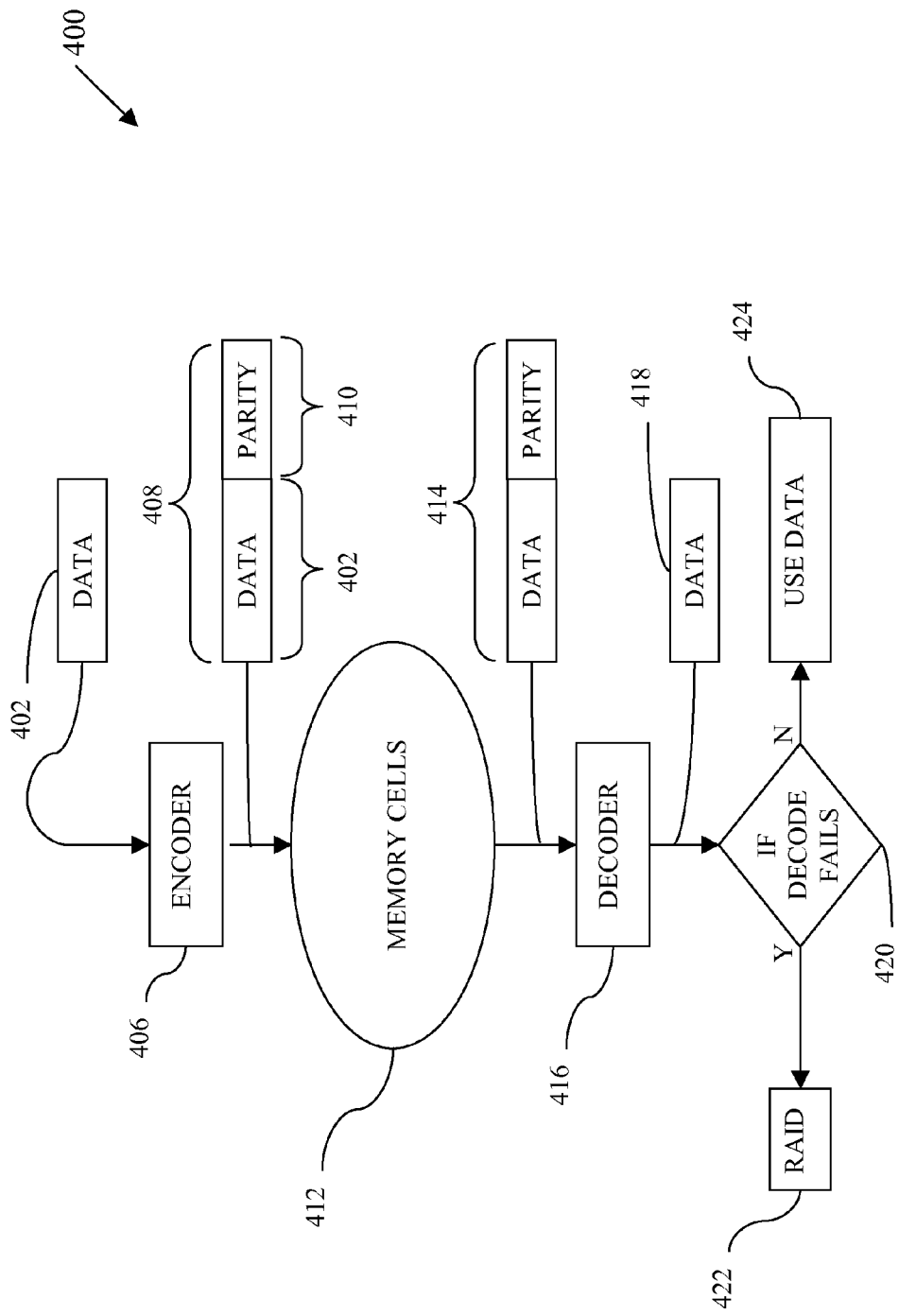
FIG. 4 illustrates a method for coding data, according to embodiments of the invention.

FIG. 4 illustrates, generally at 400, a method for coding data, according to embodiments of the invention. With reference to FIG. 4, a general amount of data is represented at 402, which can be referred to as a chunk of data. The data 402 is input into an encoder 406. The data 402 is encoded by the encoder 406, thereby producing encoded data 408. Encoded data 408 can be represented by data 402 and parity bits 410 (systematic form). Those of skill in the art will recognize that the result of the encoding 406 can also be represented with the data bits and parity bits mixed together (not shown).

The encoded data 408 is written to the memory cells 412. As described above in conjunction with FIG. 1 and FIG. 2 a memory controller is used together with commands from a host processor to issue write and read commands causing encoded data to be written to and read from the memory cells 412. In various embodiments the memory cells 412 can be made using NAND flash, NOR flash, etc. Embodiments of the invention are not limited by the type of memory cells 412. In various embodiments, the memory system 100 (FIG. 1) and/or the memory controller 200 (FIG. 2) are used to perform the methods described in FIG. 4.

A read instruction issued from a host processor causes the encoded data 414 to be read from the memory cells 412. The encoded data 414 is fed to a decoder 416. The decoder 416 decodes the encoded data 414 outputting the data 418. Any decoding algorithm can be used for soft-decision or hard-decision decoding such as belief-propagation, min-sum, normalized min-sum, and bit flip, etc for LDPC coding schemes. In various embodiments, a progressive number of soft bits can be used as inputs during soft-decision decoding.

At a block 420 the success of the decoding process is tested. A syndrome is computed for the code words (following error correction) and if the syndrome is zero the decoding is judged to have concluded successfully. Depending on the number of errors embodied in the encoded data 414 read from the memory cells 412 a situation can arise where the decoding fails to produce the data from the decoding process. Decoding failure is indicated when a syndrome is non-zero. In such a case the data is recovered by applying a RAID process at a block 422. If the decoding was successful, the data is deemed to be free of errors at a block 424 and is returned to the host processor.

A variety of different error correction codes can be used such as Reed-Solomon Codes, Bose-Chaudhuri-Hochquenghem (BCH) Codes, Low Density Parity Check Codes (LDPC), Quasi-cyclic Low Density Parity Check Codes (QC-LDPC), etc. The allowed probability of error in the data read from the memory cells after correction is dependent on the use case of the application for the memory. For example, price sensitive consumer applications experience a relatively low number of read accesses during the lifetime of the product. Thus, the consumer applications can tolerate a higher probability of read errors than high-end applications which subject the memory to a high number of memory accesses (program/erase cycles) during the memory lifetime. High-end applications are often referred to as enterprise applications. Some memory cells, such as those made using NAND Flash memory, experience increased probability of errors with ageing as the number of program-erase cycles accumulate.

Considering an application of memory cells for a solid state disk (SSD) for enterprise applications, a typical target uncorrectable bit error rate (UBER) is $1\times10^{-15}$ to $1\times10^{-16}$. When a BCH code is used the data chunk size "DW" and the error correction capability of a BCH code is chosen based on the target UBER for a given design, where: UBER=$P_{CW}$/DW. $P_{CW}$ is the page error probability and DW is the data chunk size being encoded. When a LDPC code is used, often it is designed to correct up to a certain raw bit error rate, such that the number of times it fails to decode correctly does not exceed the UBER. Someone skilled in the art will often refer to a LDPC code correcting up to a certain raw bit error rate, but it's understood that it doesn't always mean that all errors up to that certain raw bit error rate are correctable. Thus, for a LDPC code, a correctable raw bit error rate limit is understood to mean that the number of failures to decode correctly does not exceed the target UBER even though there are times where the LDPC code fails to decode up to the correctable raw bit error rate limit of the LDPC code. Thus, a correctable raw bit error rate limit of a LDPC code is characterized by a fuzzy edge.

Figure 5:
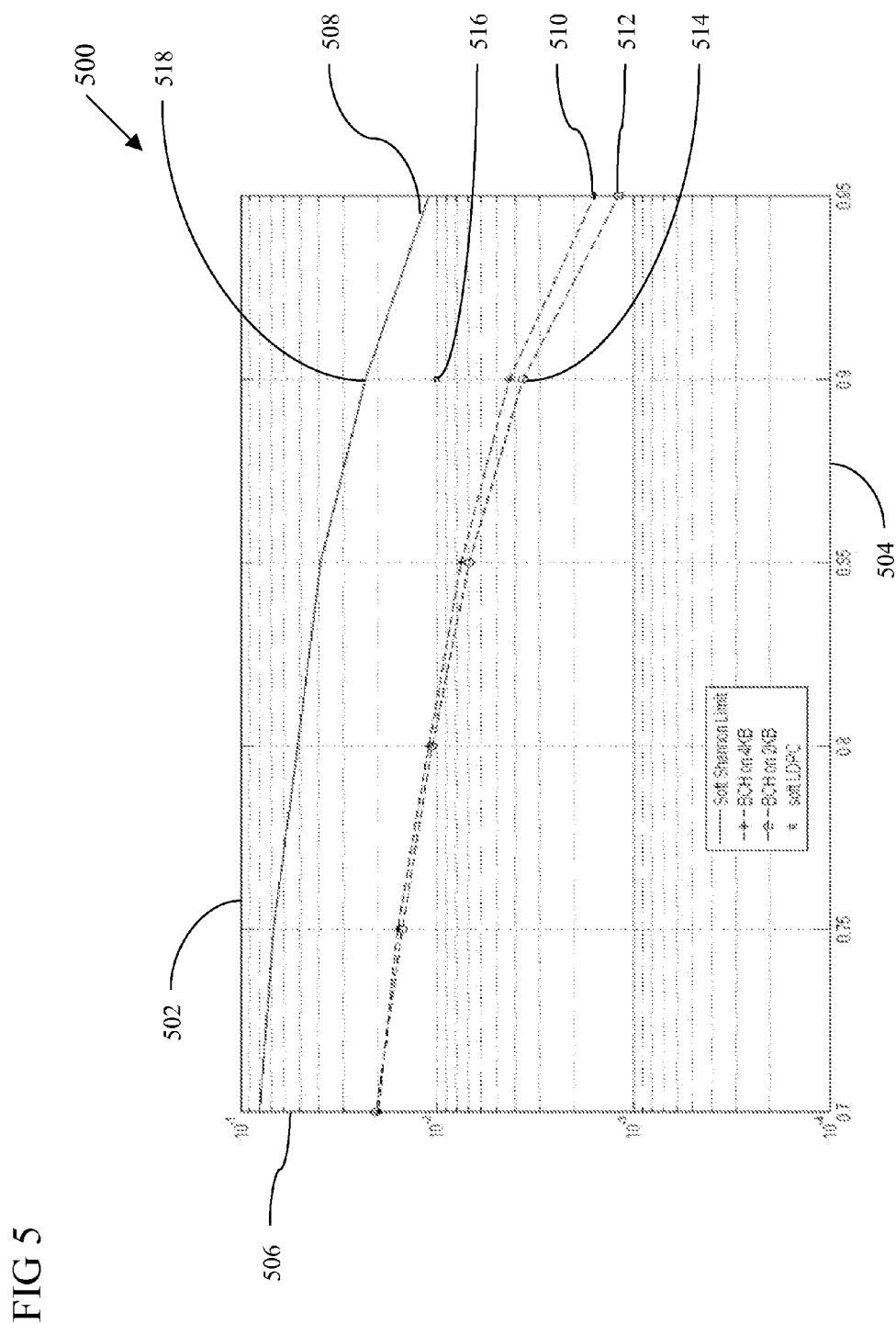
FIG. 5 illustrates correctable raw bit error rate limits for soft-decision coding, according to embodiments of the invention.

FIG. 5 illustrates, generally at 500, correctable raw bit error rate limits for soft-decision coding, according to embodiments of the invention. With reference to FIG. 5, the vertical axis represents correctable raw bit error rate limit 506. The horizontal axis represents code-rate 504. For an UBER of $1\times10^{-15}$ the performance of several codes has been plotted on the graph 502. A curve 508 represents the soft-decision Shannon limit. The Shannon limit represents the theoretical maximum correctable raw bit error rate that can be obtained for a given code-rate and decoding method. Thus, from curve 508 as the numerical value of the code-rate increases (approaching 0.95) the correctable raw bit error rate limit decreases. A higher code-rate corresponds to less parity bits for a given number of data bits and the resulting code is able to correct less errors. A lower code-rate corresponds to more coding (more parity bits) and the resulting code is able to correct more errors. In order for the BCH codes to provide the same correctable raw bit error rate limit as the LDPC code at 0.9 code-rate, the BCH codes would require a 0.8 code-rate which adds a 12.5% bit overhead, thus requiring more storage space for parity bits. Wherever a LDPC code is used in this description of embodiments, a quasi-cyclic low density parity check (QC-LDPC) code can be used in place thereof.

During soft decision decoding, data is often read multiple times from the memory cells. In flash memory systems, the data is typically read a page at a time. The page can be read multiple times and a number of soft bits of information can be dynamically allocated (increased) during decoding according to embodiments of the invention. The data read from the memory cells is often transferred to dynamic random access memory (DRAM) during decoding. Reading memory pages multiple times can add read time latency to the decoding process which must be considered for a particular use case. Constructions of LDPC codes and QC-LDPC codes exist that approach very close to the Shannon limit when soft-decision decoding is implemented.

Two BCH codes are plotted on the graph 502 in FIG. 5. A curve 512 represents the correctable raw bit error rate limit for a BCH code, which operates on a 2 KB chunk size of data. A curve 510 represents the correctable raw bit error rate limit for a BCH code which operates on a 4 KB chunk size of data. A correctable raw bit error rate for a code-rate of 0.9 using an LDPC code is indicated at 516. The LDPC code performance indicated at 516 is closer to the Shannon limit 518 than either of the BCH codes 510 or 512. Coding BCH codes with a 4 KB chuck size of data 510 increases the correctable raw bit error rate over that achieved by coding with a 2 KB chunk size of data 512, as can be seen in FIG. 5.

Figure 6:
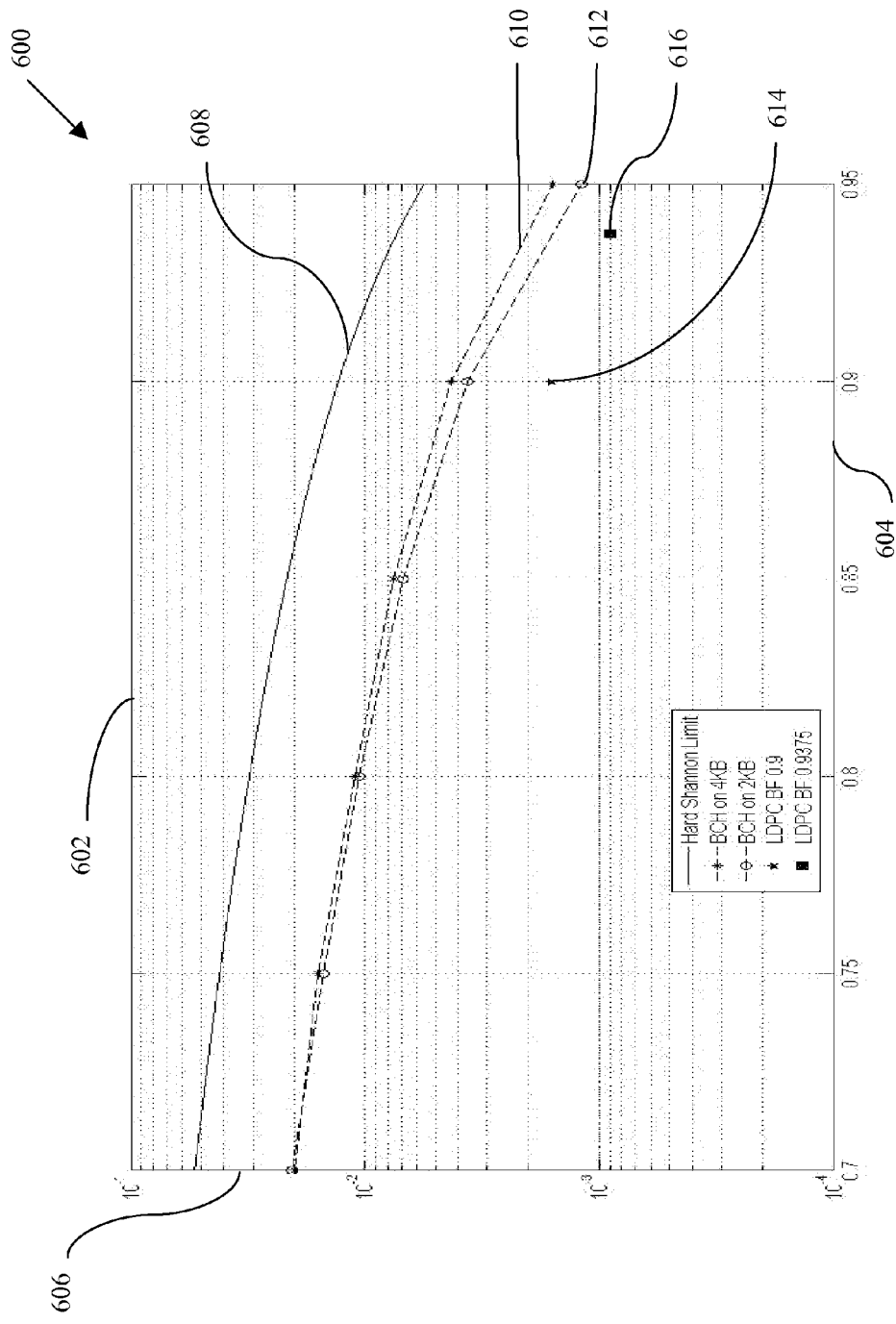
FIG. 6 illustrates correctable raw bit error rate limits for hard-decision coding, according to embodiments of the invention.

FIG. 6 illustrates, generally at 600, correctable raw bit error rate limits for hard-decision coding, according to embodiments of the invention. With reference to FIG. 6, the vertical axis represents correctable raw bit error rate limit 606. The horizontal axis represents code-rate 604. For an uncorrectable bit error rate (UBER) of $1 \times 10^{-15}$ the performance of several codes has been plotted on the graph 602. A curve 608 represents the hard-decision Shannon limit. The Shannon limit represents the theoretical maximum correctable raw bit error rate that can be obtained for a given code-rate and decoding method. Thus, from curve 608 as the numerical value of the code-rate increases (approaching 0.95) the correctable raw bit error rate limit decreases. Just as seen in FIG. 5, a higher code-rate corresponds with less coding which means less parity bits and the resulting code is able to correct less errors. A lower code-rate corresponds to more coding (more parity bits) and the resulting code is able to correct more errors.

Two BCH codes are plotted on the graph 602 in FIG. 6. A curve 612 represents the correctable bit error rate limit for a BCH code which operates on a 2 KB chunk size of data. A curve 610 represents the correctable raw bit error rate limit for a BCH code which operates on a 4 KB chunk size of data. Point 616 represents a correctable raw bit error rate for a code-rate of 0.9375 using an LDPC code. Point 614 represents a correctable raw bit error rate limit for an LDPC code at a code-rate of 0.90. The LDPC code performance using hard-decision decoding (614 and 616) (bit flipping in the figure) are further from the Shannon Limit 608 than the BCH codes using hard-decision decoding (610 and 612). The BCH code with a 4 KB chuck size of data 610 increases the correctable raw bit error rate over that achieved by coding with a 2 KB chunk size of data 612, as can be seen in FIG. 6.

Correcting errors in memory systems as described above requires dedicated resources. Chip space must be allocated for the storage of parity bits; encoder and decoder also require dedicated chip space. Different decoding methods have different read latency due to the variable decode latencies. As mentioned above, different use cases present different design parameters for the error correction systems and methods. Accordingly, embodiments of the invention are used to provide a memory system (such as 102 in FIG. 1) with the ability to adjust the correctable raw bit error rate limit of the memory system. Such adjustment of the correctable raw bit error rate limit can be achieved with a single set of hardware, thereby saving considerable resources since the same encoder and decoder can be used for a variety of use cases.

Figure 7:
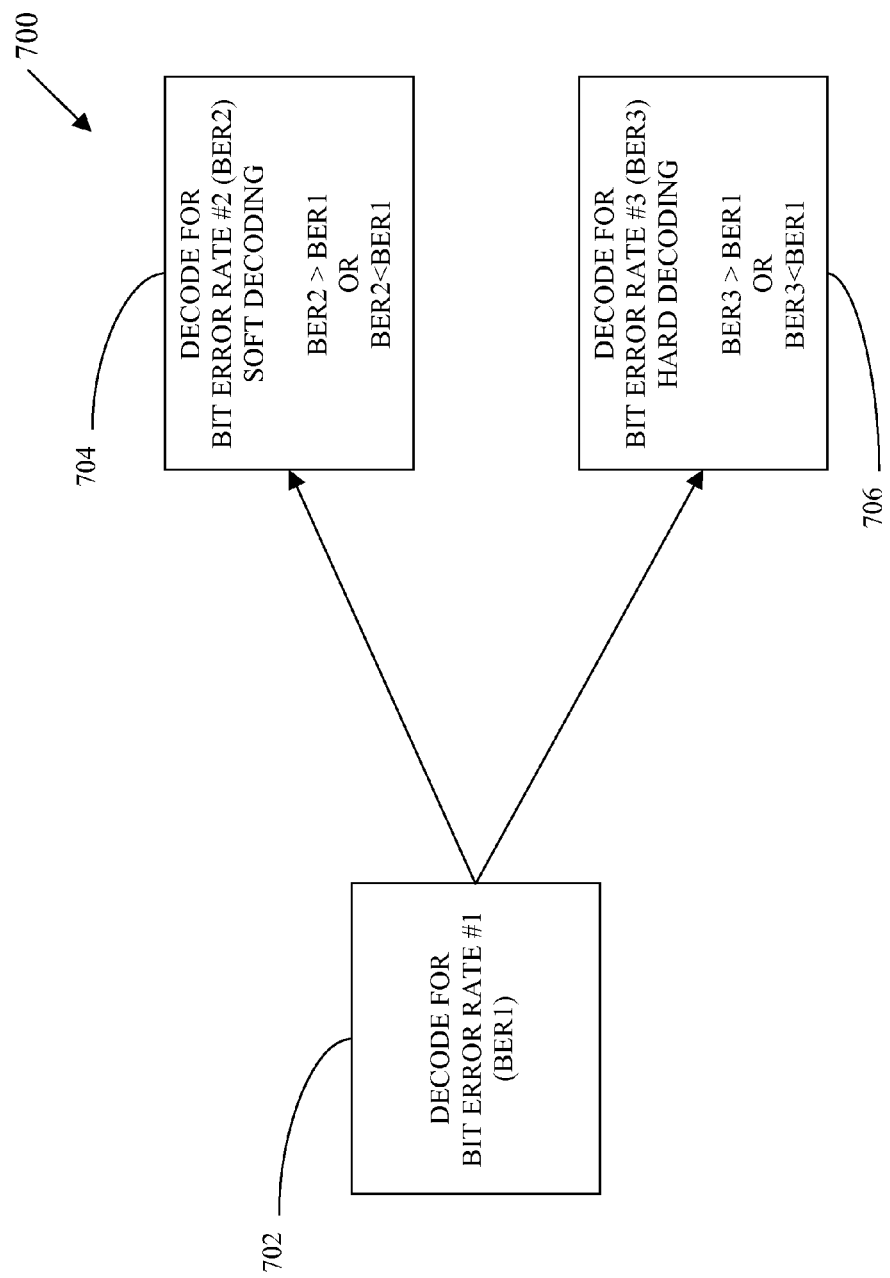
FIG. 7 illustrates multiple methods to adjust a correctable raw bit error rate limit, according to embodiments of the invention.

FIG. 7 illustrates, generally at 700, multiple methods to adjust a correctable raw bit error rate limit, according to embodiments of the invention. With reference to FIG. 7, a decoding process for a memory system is designed to write and read data to memory elements as previously described above. In one or more embodiments, the coding process begins its operation using an LDPC Code with hard-decision decoding at a block 702. The design point is selected for the particular use case such that the selected LDPC Code and code-rate provide a correctable raw bit error rate limit (BERT) with the desired probability against page read failure. In some embodiments, the design point is selected to correct errors up to a raw bit error rate of $1 \times 10^{-2}$.

An adjustment to the correctable raw bit error rate limit of the system can be made by various methods. In one method, the decoding is switched from hard-decision decoding to soft-decision decoding at a block 704, while maintaining a constant code-rate. The resulting correctable raw bit error rate limit after adjustment is now BER2. Note that BER2 is greater than BER1 when the switch was from hard-decision to soft-decision decoding. In one embodiment, an example of such an adjustment is to begin the decoding at 614 (FIG. 6) using hard-decision decoding. Note that the correctable raw bit error rate limit read from the graph 602 at 614 is between $1 \times 10^{-3}$ and $2 \times 10^{-3}$ at a code-rate of 0.9 for BER1. Changing to soft-decision decoding for BER2 at the same code-rate of 0.9 adjusts the correctable raw bit error rate limit up to $1 \times 10^{-2}$ at 516 (FIG. 5). Thus, an order of magnitude increase in the correctable raw bit error rate limit is achieved with this adjustment, where BER2 is greater than BER1.

Alternatively, if the decoding started at a block 702 as soft-decision decoding, which in one embodiment is represented by 516 (FIG. 5) and then transitioned to hard-decision decoding, which in one embodiment is represented by 614 (FIG. 6) at the block 704 then BER2 is less than BER1. Thus, in various embodiments an adjustment in the correctable raw bit error rate limit can result in an increase or a decrease as desired.

In another method implemented at 706, hard-decision decoding is maintained, while the code-rate is changed in order to adjust the correctable raw bit error rate limit from BER1 (702) to BER3 (706). Referring back to FIG. 6, note that a greater degree of coding (corresponding to a numerically lower code-rate) has a larger correctable raw bit error rate limit associated therewith. Conversely, a higher code-rate has a smaller correctable raw bit error rate limit associated therewith. Thus, in one example of this method, coding starts at 616 with a code-rate of 0.9375, the corresponding correctable raw bit error rate limit is $9 \times 10^{-4}$, which is referred to as BER1 for the discussion corresponding to FIG. 7. The code-rate is then changed to 0.9 at 614 (FIG. 6). The corresponding correctable raw bit error rate limit is now between $1 \times 10^{-3}$ and $2 \times 10^{-3}$ at 614, which we will refer to as BER3 for the discussion corresponding to FIG. 7. Thus by changing the code-rate from 0.9375 to 0.9 the correctable raw bit error rate limit is adjusted causing BER3 to be greater than BER1.

Alternatively, BER3 can be decreased relative to BER1 if the coding begins at a lower code-rate and is then increased. In one or more embodiments, an example of this is to begin the coding at a code-rate of 0.9 (614 in FIG. 6) with BER1 equal to between $1 \times 10^{-3}$ and $2 \times 10^{-3}$ and then increase the code-rate to 0.9375 (616 in FIG. 6) with BER3 equal to $9 \times 10^{-4}$ (616 in FIG. 6). BER3 is almost an order of magnitude less than BER2. Thus, by changing the code-rate, the correctable raw bit error rate limit can be either increased or decreased. According to embodiments of the invention, the code-rate is adjusted by making virtual adjustments to either the decoding and/or the encoding process by using the same hardware, i.e., the same generator matrix (G) and parity-check matrix (H) are used for both code-rates. A generator matrix is also referred to in this detailed description of embodiments as an encode matrix and a parity-check matrix is also referred to in this detailed description of embodiments as a decode matrix.

The adjustments to the correctable raw bit error rate limit of a memory system, described above, are performed in various ways by the memory system. For example, in one or more embodiments, data management module 206 (FIG. 2) controls the encoding and the decoding performed by 208, 210 through 216 and 218. With appropriate logic, provided either in hardware or by firm-ware, the data management module 206 switches between hard-decision and soft-decision decoding; assigns additional soft bits of precision for the log-likelihood ratio (LLR) during soft-decision decoding; and/or sets a code-rate for encoding and decoding.

Optionally, in some embodiments, a communication path exists between an encoder and a decoder, such as a communication path 224 and a communication path 226 (FIG. 2). A communication path between an encoder and a decoder permits for example, the encoder to change a code-rate based on the actual raw bit error rate in the encoded data observed during decoding.

In various embodiments, when data is encoded with an encoder (such as for example 208 through 216 in FIG. 2) the corresponding code-rate is stored in the memory cells in association with the encoded data. Storing the code-rate in association with the encoded data permits a decoder to use the proper code-rate during decoding. In memory systems that write and read a page of memory at a time, such as flash memory systems, the code-rate associated with each page of memory can be maintained in a data structure and stored in DRAM or on another page of flash memory for example.

In some embodiments, a hard-decision decoder and a soft-decision decoder are implemented with the same hardware capable of running both a hard-decision and a soft-decision algorithm. Alternatively, a hard-decision and a soft decision decoder are constructed with different hardware.

Figure 8:
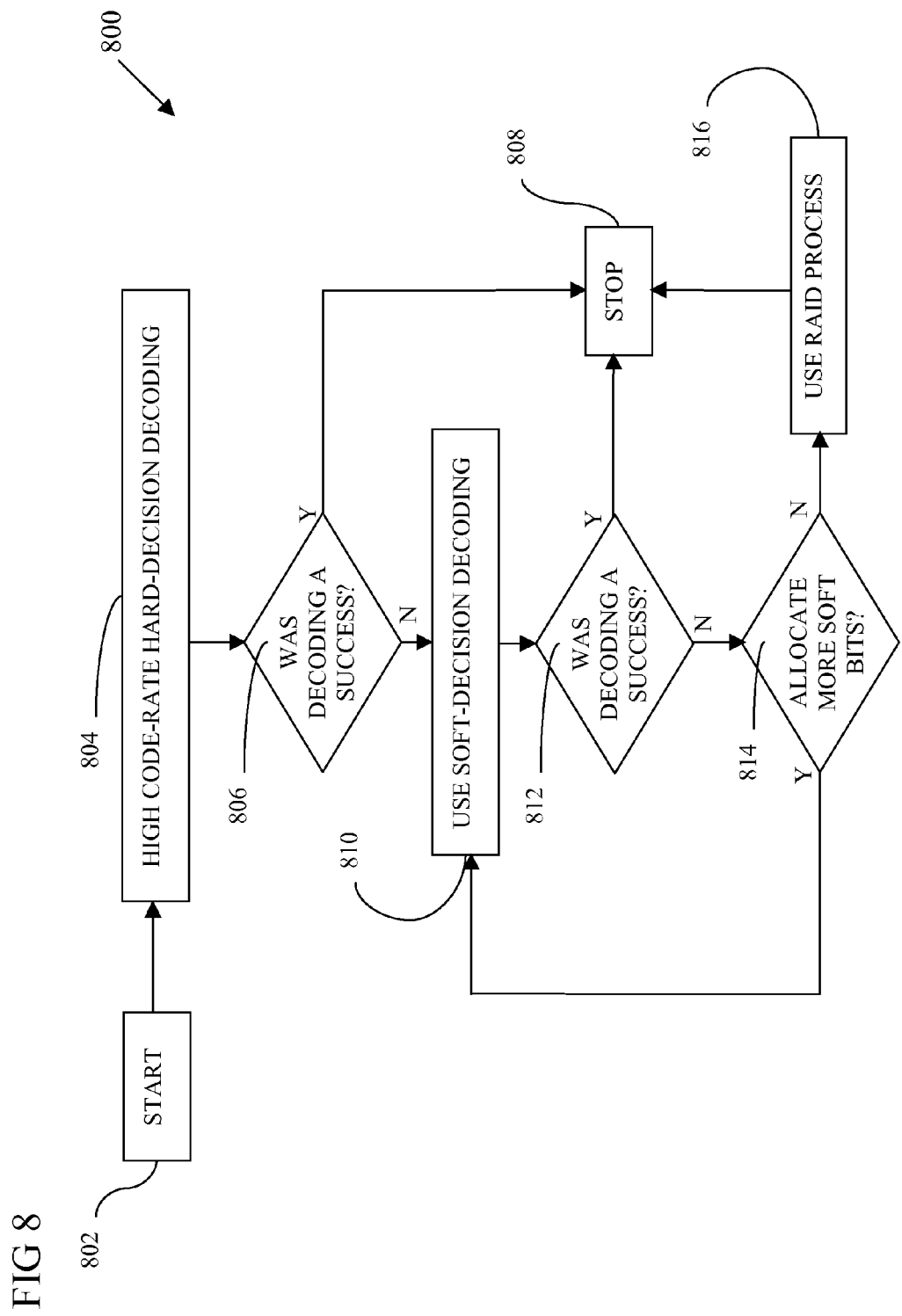
FIG. 8 illustrates methods for adjusting the correctable raw bit error rate limit, according to embodiments of the invention.

FIG. 8 illustrates, generally at 800, methods for adjusting the correctable raw bit error rate limit, according to embodiments of the invention. In various embodiments, the methods described in conjunction with FIG. 8 are implemented by the memory systems described in FIG. 1 and FIG. 2 above. With reference to FIG. 8, a process starts at a block 802. At a block 804, decoding begins with hard-decision decoding, where the data is encoded at a high code-rate. In some embodiments, the code-rate will be the highest code-rate permitted within a given design, in other embodiments the starting code-rate will be less than the highest code-rate permitted within a given design. At the block 804, hard-decision decoding is applied to encoded data read from memory cells. In order for decoding to complete successfully, an amount of errors residing in the encoded data must be less than a correctable raw bit error rate limit that a given code can correct. For example, in one embodiment, if the LDPC code represented at 614 (FIG. 6) was implemented in the decoding process of block 804 then the actual raw bit error rate residing in the data would have to be less than the correctable raw bit error rate limit represented by 614. If the actual raw bit error rate residing in the encoded data exceeds the correctable raw bit error rate limit 614 then the decoding will fail because there will be too many errors for the error correction code to correct. At a block 806, if the decoding was successful, then the process stops at a block 808. Successful decoding results when the syndrome equals zero. If the decoding was not successful at 806, then the decoding is changed to soft-decision decoding at a block 810 and the data is decoded using soft-decision decoding.

If the soft decision decoding (performed at the block 810) is not successful at a block 812, then at a block 814 more soft bits are allocated and soft-decision decoding is performed again on the encoded data. Changing a number of soft bits allocated for message values during soft decision decoding, changes a dynamic range for the message values. Message passing during decoding is described more fully below in conjunction with FIG. 11D. In various embodiments, if the decoding fails again after the first increase in soft bits, additional soft bits are allocated at 814 and another attempt at soft-decision decoding is executed at 810. If decoding is successful at 812 then the process stops at the block 808. If the decoding is not successful at 812 and the maximum number of soft bits has been allocated at 814 then the data are recovered using a redundant array of independent disk drives (RAID) operation at 816. The RAID operation can be performed using a plurality of discrete disk drives or the RAID function can be performed using channels of a given disk drive. Any level of RAID can be applied and versions of RAID, embodiments of the invention are not limited by the version of RAID implemented in the block 816.

In some situations, the possibility exists for the decoding process to reach completion, appearing to be successful, when in fact the decoding was not successful. This can happen, for example, with LDPC codes or QC-LDPC codes when the error count is high. In order to provide a second check on the primary decoding process, in various embodiments, a second encoding operation is performed with another code such as a BCH or cyclic redundancy check (CRC) code and the result is concatenated to the primary error correction code, LDPC or QC-LDPC code, as is appropriate. Then on decode, the output from the primary decoding process is input into the second decoding process, e.g., BCH or CRC. If the output from the second decoding process produced a valid code word then the validity of the primary decoding process is verified. If the second decoding process proves that the primary decoding process failed then RAID is used to recover the data as described above. Techniques such as this are used to ensure that the decoding process did in fact produce a valid code word.

In one non-limiting embodiment, the methods described above can be applied to a solid state disk (SSD) drive in order to adjust a correctable raw bit error rate limit to accommodate an increase in the actual raw bit error rate occurring for example by ageing of the device. In other non-limiting embodiments, the methods described above can be applied to enable a single error correction system/memory system to be used for a variety of use cases. Thereby, using one physical hardware implementation for a variety of use cases. Thus, resources are saved by reducing the need for customized memory system designs and implementations.

Figure 9:
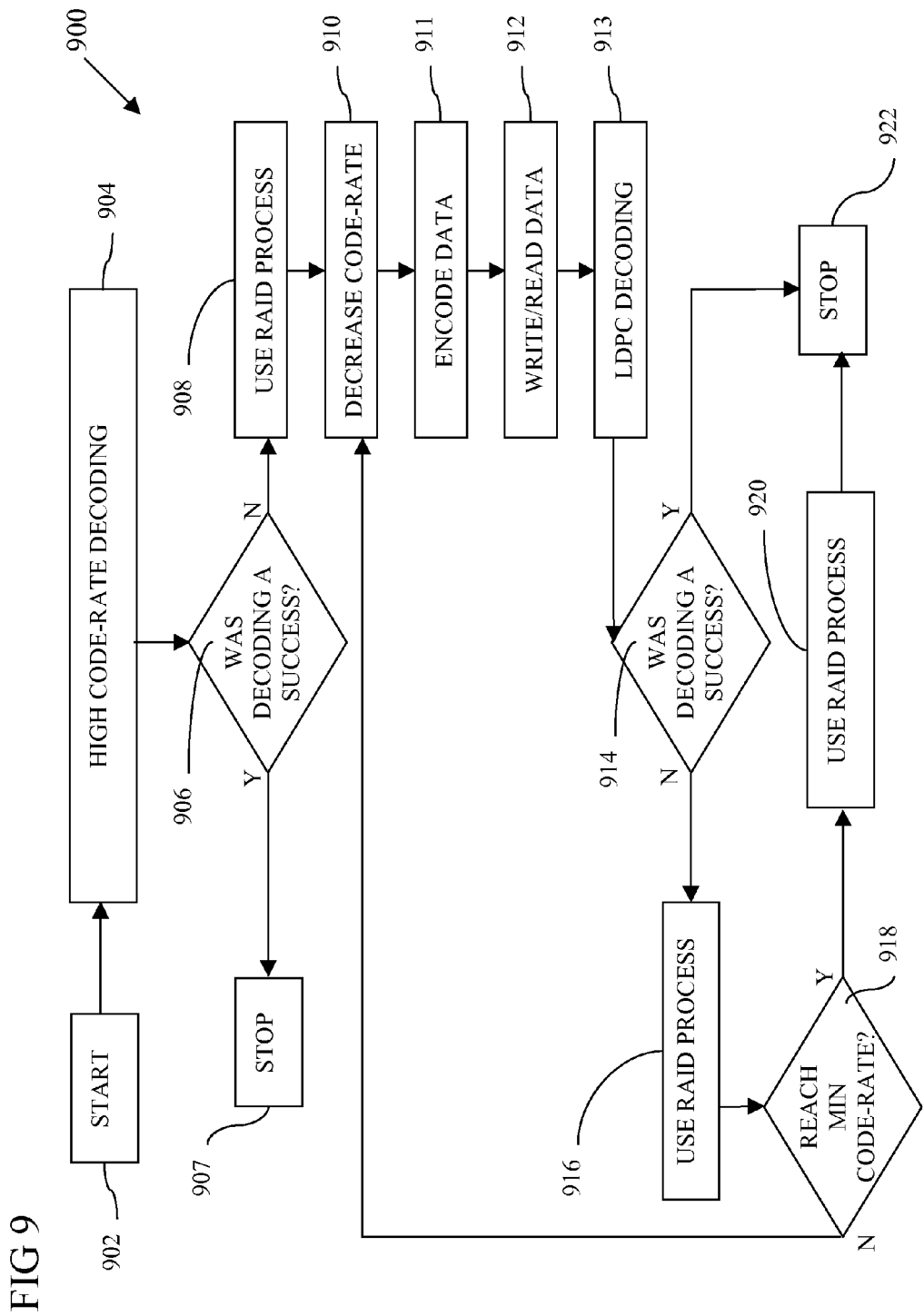
FIG. 9 illustrates further methods for adjusting the correctable raw bit error rate limit, according to embodiments of the invention.

FIG. 9 illustrates, generally at 900, further methods for adjusting the correctable raw bit error rate limit, according to embodiments of the invention. In various embodiments, the methods described in conjunction with FIG. 9 are implemented by the memory systems described in FIG. 1 and FIG. 2 above. With reference to FIG. 9, a method starts at a block 902. At a block 904, data is decoded using hard-decision decoding, where the data was encoded at a high code-rate. In some embodiments, the code-rate will be the highest code-rate permitted within a given design, in other embodiments the starting code-rate will be less than the highest code-rate permitted within a given design. At a block 906 the decoding is tested. If the syndrome calculation equals zero then decoding was successful and the process terminates at a block 907. If the outcome of the syndrome calculation is non-zero then the decoding failed and the data are recovered by using the RAID process at a block 908. A decoding failure indicates that the estimated raw bit error rate is too high for the selected code-rate; therefore the code-rate is decreased. In some embodiments, at the block 906, the decoding is tested and the number of corrected bits is counted. When a number of corrected bits cross a threshold value, the code-rate is preemptively decreased (before a decoding failure can occur) thereby avoiding a decoding failure. The threshold value is less than the correctable raw bit error rate limit. Resorting to use of a RAID function to recover the data has been either greatly reduced or eliminated and in some embodiments a RAID function will not be part of the system.

At a block 910 the code-rate is decreased and at a block 911 data is encoded at the new decreased code-rate that was established at the block 910. At a block 912 the encoded data from the block 911 is written to the memory cells and read back from the memory cells. The write and read operation of block 912 need not occur proximate in time. There might be substantial time passing in between the read and write operation of the block 912. Note that the same encode and decode hardware is used at the various code-rates that are selected.

At a block 913 LDPC decoding is applied to the encoded data that was read at the block 912. At a block 914 the decoding is checked to see if it was successful (syndrome equal to zero). If the decoding was successful then the process stops at a block 922. If the decoding was not successful, then the data is recovered by applying a RAID process at a block 916. Following the RAID process applied at the block 916 a check is made at a block 918 to see if the code-rate has reached a minimum code-rate available for the coding scenario implemented by the memory system. For example, a minimum code-rate (native code-rate) for a particular LDPC code is illustrated in FIG. 10A in column 1010 row 1020 as 0.19. If the minimum code-rate has not been reached, then the code-rate is decreased again at the block 910 and the process continues as described above. If the code-rate has cycled down to the minimum code-rate then the data are recovered by applying a RAID process at a block 920 and then the process stops at a block 922.

In various embodiments, the methods and apparatuses of FIG. 8 are used together with the methods and apparatuses of FIG. 9. In some embodiments, the same apparatus is used to perform the methods taught by FIG. 8 and FIG. 9. In one or more embodiments, at the block 806 (FIG. 8) a number of errors is counted and when the number of errors cross a threshold value, instead of stopping at the block 808 the code-rate is preemptively decreased as described above in conjunction with FIG. 9 to either decrease the chances of needing to use a RAID function or avoiding the use of a RAID function to recover the data at a future time when there might not be any more soft bits to allocate.

Decreasing the code-rate increases the number of parity bits and it increases the correctable raw bit error rate limit for the encoded data as described above in conjunction with FIG. 7. In various embodiments, multiple methods to decrease the code-rate are described in detail below. In one embodiment, a virtual adjustment is made to both the encoder and the decoder when the code-rate is changed.

Figure 10B:
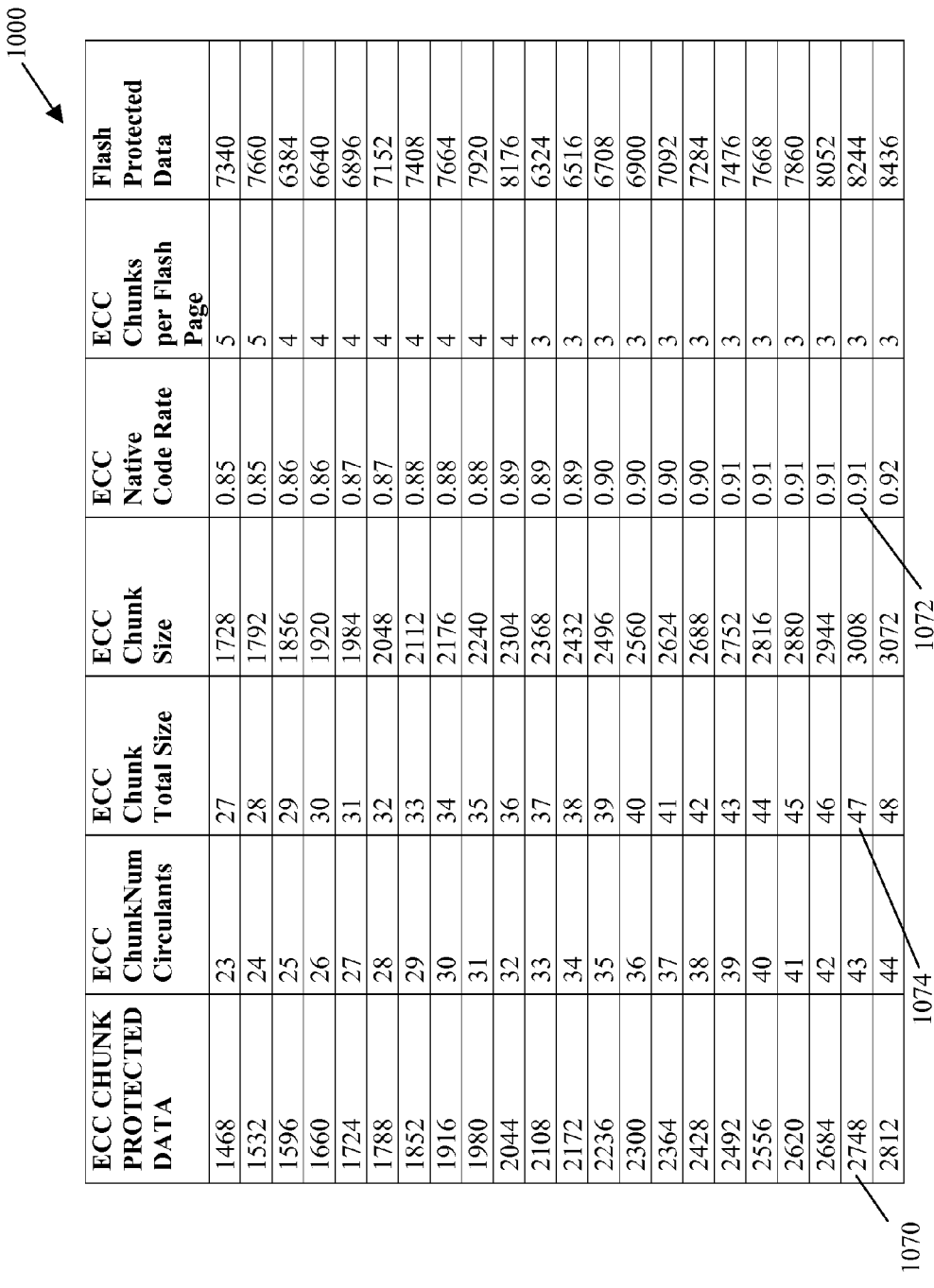
FIG. 10B is a continuation of the table of FIG. 10A.

FIG. 10A illustrates, in a table 1000, parameters for a Quasi Cyclic-Low Density Parity Check (QC-LDPC) code, according to embodiments of the invention. FIG. 10B and FIG. 10C are a continuation of the table 1000 from FIG. 10A. With reference to FIG. 10A, FIG. 10B, and FIG. 10C, in one embodiment, some parameters of a QC-LDPC code are displayed in table 1000. Referring to table 1000, column 1002 lists error correction code (ECC) chunk protected data with the units of bytes. A value of 60 bytes is indicated at 1020.

Note that 4 bytes have been allocated for the secondary CRC code, thus 60 bytes are available for protected data. As described above in some embodiments, a secondary code, such as CRC or BCH, is used to validate whether the LDPC code decoded correctly. Column 1004 indicates the ECC chunk number of circulants in one row of the encode matrix G and the decode matrix H. Column 1006 labeled "chunk total size" lists the total number of circulants in one row of the encode matrix G and the decode matrix H. In the implementation of FIG. 10A-FIG. 10C, the parity data are continued in four circulants independent of code-rate, therefore the value for each row in column 1006 is four greater than the value shown in column 1004. Column 1008 lists the ECC chunk size with units of bytes. The value listed in column 1008 is equal to four bytes added to the value shown in column 1002 times the value listed in column 1006. Column 1010 lists the ECC native code-rate, which is column 1002 divided by column 1008. Column 1012 lists the ECC chunks (number of code words) that fit on a page of flash memory. The data storage capacity of a page of flash memory depends on the technology of the given flash chip. The flash page used in the example of column 1012 assumes a nominal 9 Kbyte flash page size. Column 1014 lists the flash protected data with units of bytes. Column 1014 is obtained by multiplying column 1002 times column 1012.

For the particular QC-LDPC code selected for this non-limiting example, in one embodiment, table 1000 displays the relationship between code-rate and the amount of data that can be stored on a page of flash memory cells. Note that row 1020 provides the minimum amount of flash protected data, i.e., 1,680 Bytes (column 1014) and a maximum amount of parity bits using a code-rate of 0.19 (column 1010). The amount of parity bits generated at the 0.19 code-rate exceeds the amount of data stored on a single flash page. At the other end of the code-rate range, row 1060 uses a code-rate of 0.94 (1062) and provides for the storage of 8,568 Bytes of data on a page of flash memory cells with a minimum amount of parity bits. The amount of parity bits generated at the 0.94 code-rate is much less than the amount of data stored on a page of flash memory cells. Thus, the storage waste (due to the storage of generated parity bits) is smaller at the higher code-rates. All other code-rates between 0.19 and 0.94 provide different amounts of storage of data and parity bits. Thus, different use cases can be accommodated with the QC-LDPC code discussed in table 1000.

In the examples described and discussed above one way to change the correctable raw bit error rate limit for the error correction code process of a memory system is to change the code-rate of the encoding and decoding processes. An example of the effects on the encode and the decode matrices can be observed in table 1000. In one embodiment, decoding starts at the highest code-rate (0.94 column 1010 at 1062) indicated by row 1060. Assume that for a particular hypothetical use case it is desired to change the code-rate to 0.91 which is row 1070 at 1072 in table 1000. Decreasing the code-rate will increase the correctable raw bit error rate limit as discussed previously above, thereby allowing a larger actual raw bit error rate to be corrected by the memory system.

In one embodiment, changing the code-rate is accompanied by making a virtual adjustment in the encode and decode process by using the same encode matrix G and the same decode matrix H for both code-rates. Only one set of hardware is required. The virtual adjustment to the encode matrix G and the decode matrix H can be accomplished in a variety of ways.

An example of a decode matrix H and a corresponding encode matrix G using a LDPC code is illustrated below with FIG. 11A through FIG. 11D. For purposes of ease in illustration the decode and encode matrices are shown generally in the figures constructed from circulant matrices. A Tanner graph representation (FIG. 11D) is used to illustrate the decoding process and the use of strong LLR values during decoding. When encoding and decoding is implemented in the memory systems described herein, for example in FIG. 1 and FIG. 2, various hardware implementations are used. In one or more embodiments in hardware, a series of shift registers are used to implement LDPC encoding and decoding. In other embodiments, the encoding and decoding functions are performed in software. Those of skill in the art will understand that while an encode matrix G has been set forth in FIG. 11B it is derived from the decode H matrix and could have been represented as a mathematical manipulation of the decode H matrix from FIG. 11A with no loss of generality. Thus, an encoder, such as 208 through 216 (FIG. 2) can be configured from either a single encode matrix or a single parity check matrix (decode matrix).

Figure 11A:
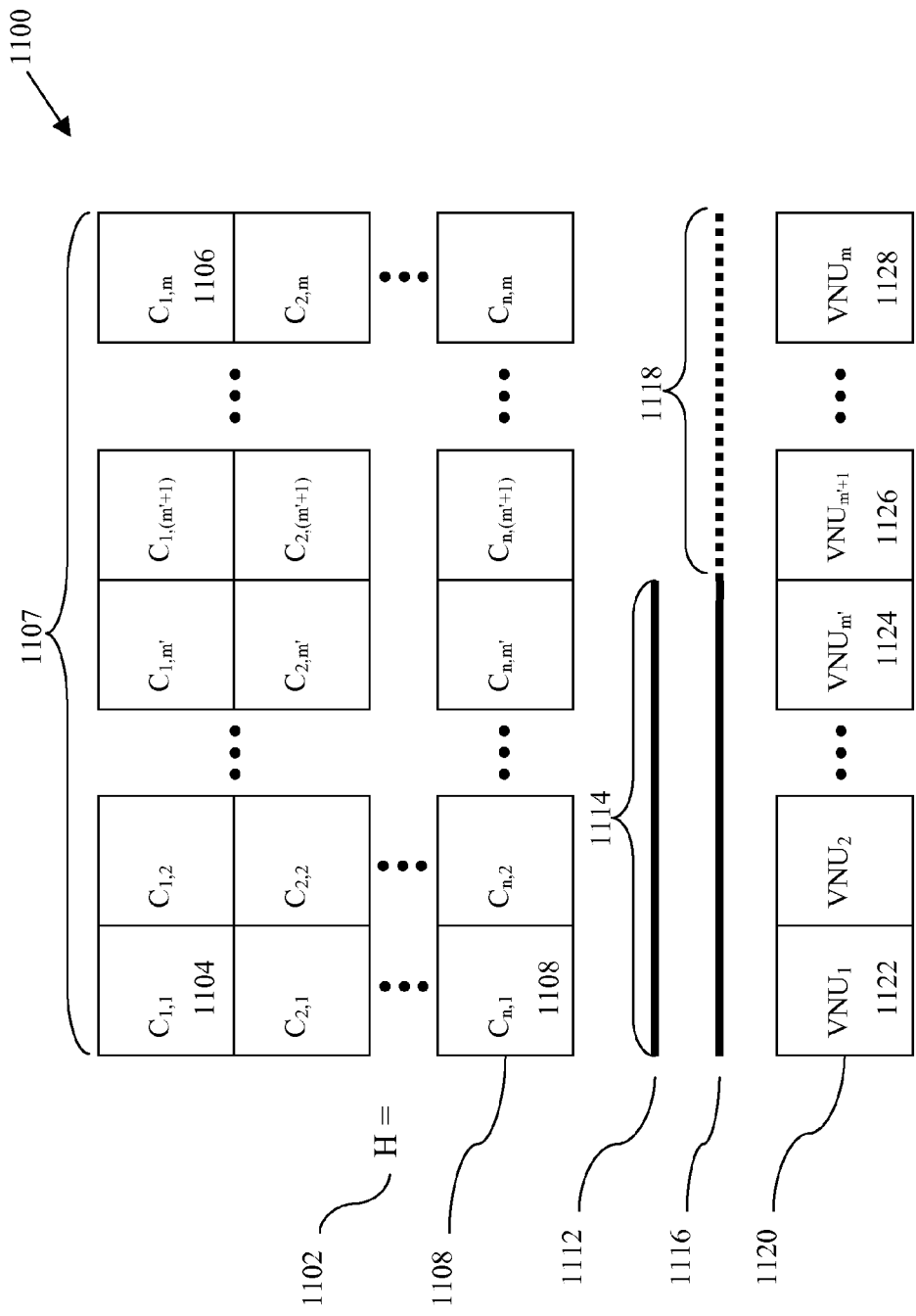
FIG. 11A illustrates a virtual adjustment related to a code-rate change, according to embodiments of the invention.

FIG. 11A illustrates, generally at 1100, a virtual adjustment related to a code-rate change, according to embodiments of the invention. With reference to FIG. 11A, H matrix 1102 is used for decoding and a decoder is configured from a single decode matrix such as H matrix 1102 for example. H matrix 1102 includes a number of circulants, for example $C_{1,1}$ indicated at 1104. A circulant is described more fully below in conjunction with FIG. 11C. H matrix 1102 is constructed from a general number of circulants indicated by variable "m" to designate a general number of columns of circulants, e.g., $C_{1,m}$ 1106 being the circulant in the first row $m^{th}$ column. H matrix 1102 has a general number of rows of circulants indicated by variable "n," where $C_{n,1}$ indicates the circulant in the first column $n^{th}$ row at 1108. Each circulant is a matrix, in one embodiment; the circulants of H matrix 1102 have a size of 512 by 512. In other embodiments the circulants can have other dimensions such as for example 1024 by 1024.

The decoding process requires the horizontal dimension of the H matrix 1102, in bits, to equal the number of bits in the data being input to the decode process. Thus, for H matrix 1102, at the start of the decoding process, the number of bits in the data input to the decoder is equivalent to the column dimension in bits of the H matrix 1102. In the case where the code-rate is reduced at a later time, following the start of decoding, the length of the encoded data read from flash will have a smaller dimension (fewer bits) than the column dimension in bits of the H matrix 1102. This condition is illustrated in FIG. 11A in that the data read from the flash memory cells 1112 has a horizontal dimension 1114, which is less than a horizontal dimension 1107 of the H matrix 1102, due to the reduced code-rate. Note that this later time when the code-rate was reduced can be any length of time and in some cases it might be measured in a fraction of a second, days, months or years. Note further, as described in the figures above, in embodiments used with flash memory systems the code-rate used to encode data stored to a given page of flash memory cells is also stored in association with the given page of flash memory cells (for example, as described above the code-rate can be stored in a data structure and stored in DRAM or on another page of flash memory). Such an association of code-rate and stored encoded data permits a decoder to virtually adjust its dimensions to perform a correct decode at the same code-rate with which the data was originally encoded. It is important to realize that in one or more embodiments, data can be encoded differently on a chunk basis (code word). For example, a first chunk of data can be encoded using a first code-rate and a second chunk can be encoded at a second code-rate, etc. In some embodiments, chunks of encoded data (code words) are stored on a page of FLASH memory where each chunk is encoded at a different code-rate. No limitation is presented by encoding chunks of data with different parameters (i.e., code-rates) and then storing the chunks of encoded data (code words) on one or more pages of memory cells, such as FLASH memory cells.

In one or more embodiments, one way to maintain the equivalency of the horizontal dimensions is to force some bits that come out of the decoding process to be zero. This is done by feeding the decoding process with a strong log-likelihood ratio (LLR) value for bit locations 1118 so that the decoding process produces a zero in bit locations 1118. A strong LLR value is an LLR value that will not change or is strongly resistant to changing during the decoding process. Those of skill in the art will appreciate that the actual implementation of an electronic circuit for decoding can present situations where it can be desirable to allow an LLR value to degrade during decoding rather than to design the circuit to maintain a fixed LLR value that will not change during decoding. Such situations can result from timing considerations, a desire to reduce the amount of hardware used, a desire to reduce circuit complexity, etc. LLR values that are strongly resistant to changing can be used because the LLR values of the bits that are incorrect tend to have smaller magnitudes and do not unduly influence the LLR value of the strong LLR bits. Therefore, strong LLR values can be degradable, are strongly resistant to changing, and can still maintain a large enough value during decoding to produce the desired result (a decode failure rate that is within the target UBER). Thus, in this description of embodiments a strong LLR value is one that will not change or is strongly resistant to changing during decoding.

The decoding components 1120 (synonymous with a decoder in this description of embodiments) correspond to H matrix 1102 both of which have the same horizontal dimension in bits. Within portions of the decoder, indicated by decoding components 1126 through 1128, the strong LLR value is used to prevent the LLR of these bit locations from changing during the decode process. The portions of the decoder, indicated by decoding components 1122 through 1124, proceed in their usual operation to decode the encoded data corresponding to the width 1114. In this method no virtual adjustment is needed for the H matrix 1102, instead the virtual adjustment is made in terms of what is input into the decoding process.

One way of determining the magnitude of a strong LLR value for a given code is based on the maximum raw bit error rate that the system is designed to correct for (correctable raw bit error rate limit) and the type of decoding employed, i.e., hard-decision or soft-decision decoding. For example, in one embodiment, a maximum raw bit error rate is $1 \times 10^{-2}$, the largest LLR that will occur during the decoding process using hard-decision decoding is a value of 5. Therefore, in an implementation that does not permit strong LLR values to degrade during decoding a strong LLR value of 10 is selected, which is greater than 5. Any value greater than 5 is suitable for use as a strong value; no limitation is implied by selecting 10 as a strong value. The decoding process should not produce a LLR that is greater than the strong value selected. In this example, selecting a number greater than 5 such as 10 for the strong value will provide the required performance during decoding. Other strong values will work as well.

For some embodiments, a design methodology follows the approach of designing the number of circulants in H matrix 1102 so that an upper limit for a code-rate is established. For example, in one or more embodiments, in order to achieve a code-rate of 0.94 from the example of FIG. 10A through FIG. 10C, H matrix 1102 will have 71 circulants, therefore m=71. In one embodiment, the code-rate is reduced to 0.91 as discussed in conjunction with FIG. 10A through FIG. 10C above. In this non-limiting example, the chunk size at the 0.94 code-rate is 71×512=36,352 bits, where each circulant is of size 512×512. Changing the code-rate to 0.91 corresponds with line 1070 in table 1000. At 1074 the number of circulants required by the H matrix is 47; therefore, the size of the decoding process is reduced by 24 circulants or 24×512=12, 288 bits. Therefore, 12,288 bit locations are forced to a strong value during decoding. Use of strong LLR values is described below in conjunction with FIG. 11D. Note that in practice, it is inefficient to force LLR values for all bits in one or more circulants to a strong value. Doing so wastes processing resources. It is efficient to apply the strong LLR value technique in combination with virtual shortening of multiple circulants or processing engine widths (described below) when appropriate codes are used.

If decoding is performed in hardware, storing and processing 12,288 values such as 1.75, 7.126, or 13.0625 can require many floating point operations per second (FLOPS) along with the dedicated hardware, power, and heat (possibly in the order of 10 million gates). If the decoding is implemented in software these considerations are alleviated.

An alternative implementation in hardware that can save resources, chip area, power, and heat is to set a guard value for the strong LLR. In this case, the guard value is the extreme point in the LLR range. For example, if message values for LLR generated during decoding range from −3.875 to 3.875, then these values, −3.875 and 3.875 which are at the extreme ends of the dynamic range, are used to indicate positive and negative infinity and also are used for the strong LLR value during decoding. Thus, in this non-limiting example, if the decimal portion of the LLR range is quantized with three soft bits (thereby providing 0.125 quantization) then the LLR range is −3.75 to 3.75, with −3.875 and 3.875 representing minus infinity and plus infinity. This approach requires fewer resources to be dedicated to the hardware.

In the examples given above, which do not make virtual adjustments to the H matrix, there is no restriction on the type of code that can be used in the error correction code process. In these cases there is no restriction to LDPC Codes or to QC-LDPC Codes. The QC-LDPC Code of FIG. 10A through FIG. 10C is used merely for illustration.

Figure 11B:
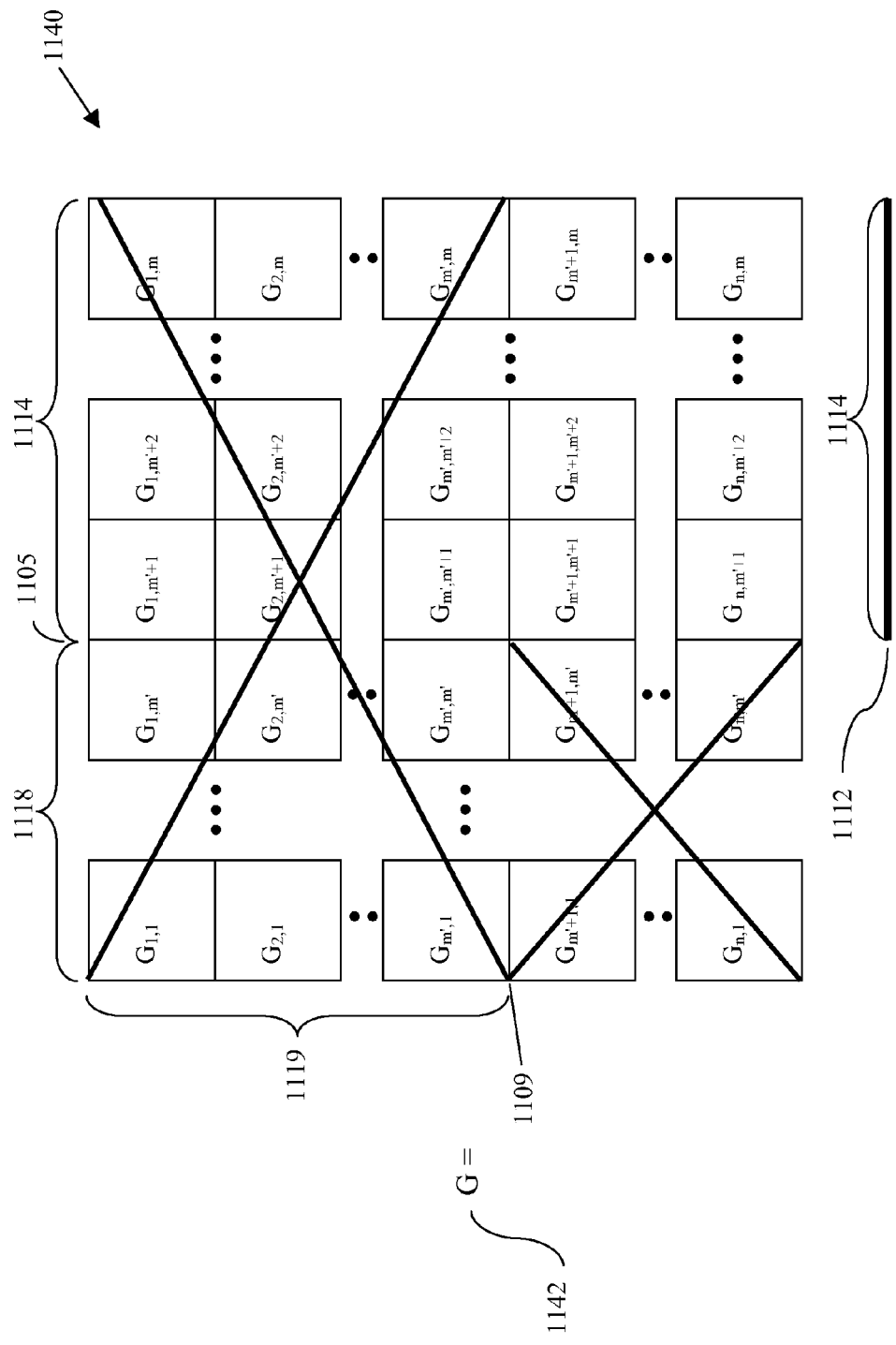
FIG. 11B illustrates another virtual adjustment related to a code-rate change according to embodiments of the invention.

FIG. 11B illustrates, generally at 1140, another virtual adjustment related to a code-rate change according to embodiments of the invention. With reference to FIG. 11B, an encode matrix G is shown at 1142. In this non-limiting example, an encoder is configured from a single encode matrix G 1142 to encode data which is then used by decode H matrix 1102 (also referred to in the art as a parity check matrix). In the case of an LDPC code, encode matrix G 1142 is constructed from a series of circulants indicated by $G_{1,1}$ through $G_{n,m}$. Note that as described above, both H matrix 1102 and G matrix 1142 have the same column dimension in bits. Therefore, when a code-rate is changed, such as when data management module 206 issues a command to reduce the code-rate at a decoder 208 through 216, encode matrix G 1142 is virtually adjusted. When shift registers are used to implement the encode G matrix 1142, virtual adjustment is accomplished in different ways depending on the implementation of the circuit. In one implementation, virtual adjustment occurs when the data management module sends a bypass signal to the encoders 208 through 216 (FIG. 2). The bypass signal eliminates the need to perform calculations using the circulants in the rows marked by 1119 and the columns marked by 1118 in FIG. 11B. Thus, the bypass signal provides a row location 1109 and a column location 1105 within the encode matrix G 1142 to start the calculation. In another implementation, virtual shortening occurs when the data management module sends a disable signal to the encoder 208 through 216 (FIG. 2). The disable signal disables that portion of the encode matrix G 1142 that will not be used after the values have been generated, indicated by 1119 and 1118 in FIG. 11B. When disabling is implemented, elements in the rows 1119 and the columns 1118 are set to zero (zero padding) in order to create a benign effect on the outcome of the calculations during encoding from these row and column entrees. In the examples of FIG. 11A and FIG. 11B the encoded data 1112 has a dimension in bits as represented by 1114 which is the same as the portion of the H matrix 1102 that will actively participate in the decoding, i.e., 1114 (FIG. 11A).

Figure 11C:
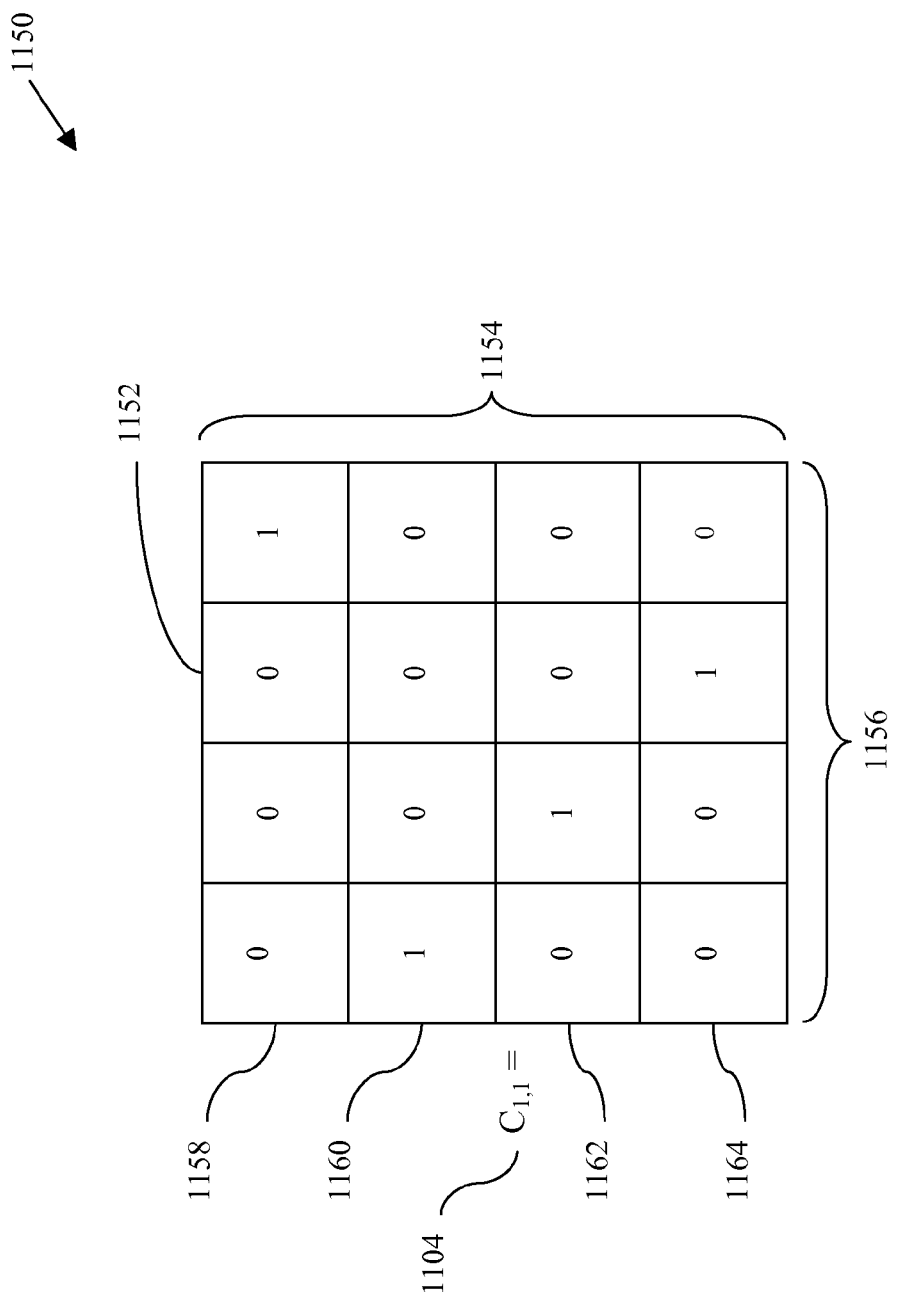
FIG. 11C illustrates an example of a circulant matrix according to embodiments of the invention.

FIG. 11C illustrates, generally at 1150, an example of a circulant matrix according to embodiments of the invention. With reference to FIG. 11C, a circulant matrix is indicated at 1104. In this example, circulant matrix 1104 is of size 4 i.e., a square matrix with four columns indicated by 1156 and four rows indicated by 1154 and weight 1. Each row of the circulant matrix 1104 is a cyclical shift of the bit pattern above it. Bits wrap around within a given row during a cyclical shift. Therefore, row 1160 is shifted one bit to the right of row 1158. Similarly, row 1162 is shifted one bit to the right of row 1160 and row 1164 is shifted one bit to the right of row 1164.

Figure 11D:
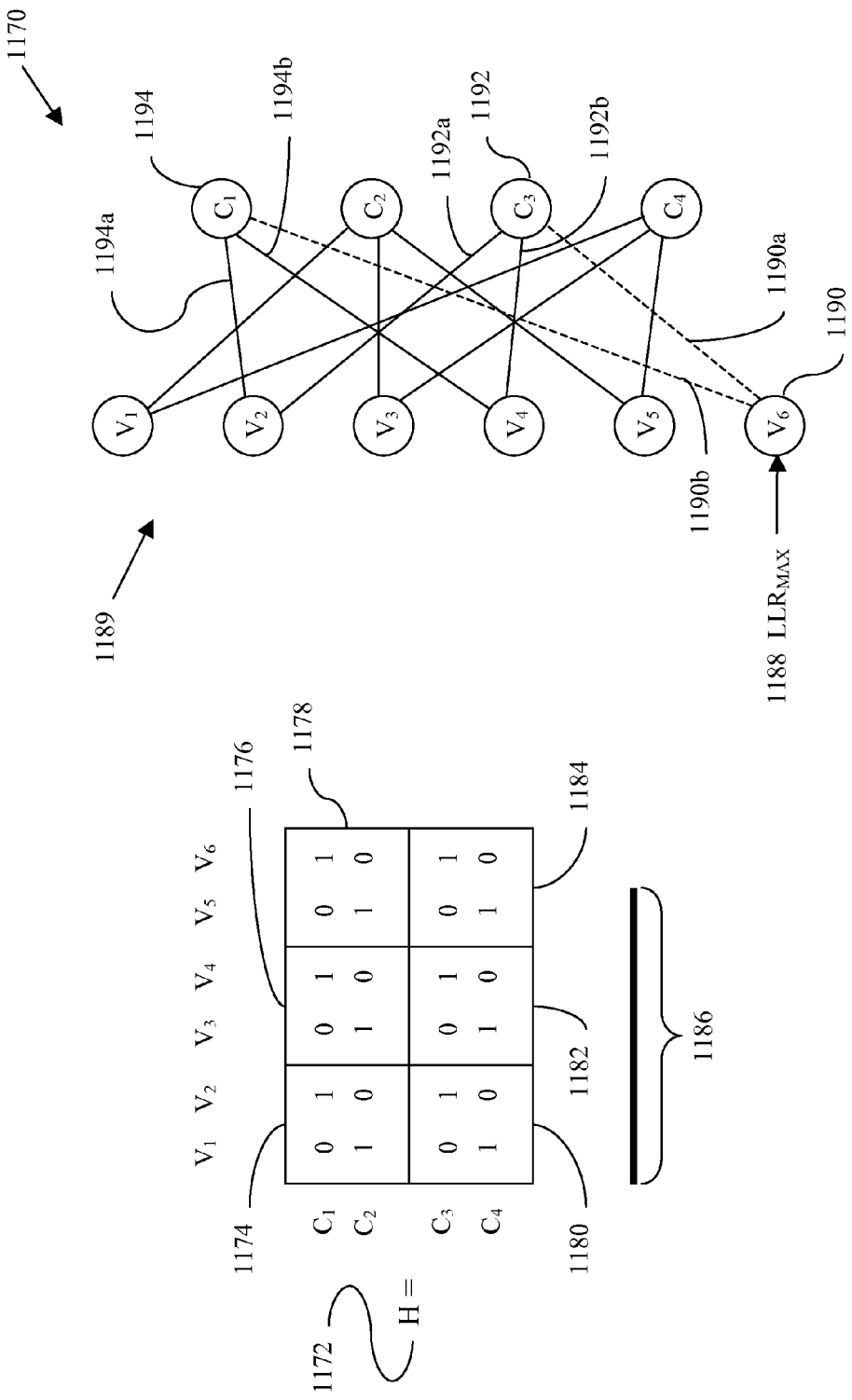
FIG. 11D illustrates using a strong LLR value with a Low Density Parity Check (LDPC) Code decoder.

FIG. 11D illustrates, generally at 1170, using a strong LLR value with a Low Density Parity Check (LDPC) Code decoder. With reference to FIG. 11D, a parity check matrix 1172 is constructed from circulants 1174, 1176, 1178, 1180, 1182, and 1184. The corresponding Tanner graph representation of the parity check matrix 1172 is shown at 1189. Symbols V1 through V6 placed over the columns of the bits of H matrix 1172 and symbols C1 through C4 placed along the rows of H matrix 1172 illustrate the correspondence between the Tanner Graph and the H matrix 1172. These symbols V1-V6 are the variable nodes and C1 through C4 are the check nodes.

At the start of decoding, the encoded data bits are loaded into the variable nodes V1-V6. During decoding, messages based on LLR values are passed between the variable nodes and the check nodes and then between check nodes and the variable nodes. Multiple iterations of message passing occur during soft-decision decoding.

In the example of FIG. 11D, six bits of encoded data can be loaded into variable nodes V1-V6. As described above, a code-rate change made by an encoder that reduces a code-rate shortens the encoded data due to the disabling or bypassing of a portion of the encode matrix. In various embodiments, a code-rate change can also be made in the encoder when a number of bits in the encoder are set to zero. In some embodiments, a number of bits that are set to zero in the encoder is equivalent to a number of bits that are set to a strong LLR value in the decoder. In other embodiments, a number of bits set to zero in the encoder is not equal to a number of bits set to a strong LLR value in the decoder. Virtual shortening within an encoder can be accomplished by different combinations of disabling or bypassing, and setting a number of bits to zero in order to produce the desired change in code-rate. Similarly, setting a number of bits to a strong LLR value, in a decoder, can be combined with virtually disabling or virtually bypassing portions of the decoder (described below in conjunction with FIG. 12) in order to achieve the desired result of changing a code-rate used by both the encoder and the decoder. Such a virtual shortening of the encode matrix results in a shortening of the encoded data. A non-limiting example of virtually shortening a decoding matrix 1172 having a column dimension of 6 bits to accommodate encoded data 1186 have a width of 5 bits is illustrated in FIG. 11D. The 5 bits of encoded data are loaded into positions V1-V5 of Tanner graph 1189. Note that in this example, in one embodiment, one bit was set to zero in the encoder in order to reduce the length of the encoded data from 6 bits to 5 bits. A strong LLR value is loaded into variable node V6. A strong LLR value is a value that is larger than the LLR values produced during decoding. As described in the preceding figures, a guard value is for example, the extreme of the LLR range. Thus, when using a guard value to represent a strong LLR value, the LLR value loaded for the variable node (V6 in the non-limiting example of FIG. 11D) is the maximum LLR value as determined from the number of soft bits in use for the LLR range.

The decoding process proceeds by updating the check nodes. In one embodiment, a check node is updated by selecting the minimum value from all of the connections from the check node to the variable nodes. For example, check node C3, indicated by numeral 1192, is connected to variable nodes V2, and V4, and V6. Check node C1 is connected to variable nodes V2, V4, and V6. Since the LLR value for variable node V6 is set to the maximum value that can occur during decoding it will never represent a minimum at check nodes C1 or C4. Therefore, V6 does not play a role during decoding since it will never be selected. The connections 1190a and 1190b are dashed to indicate that the LLR value for V6 does not influence the message passing at check nodes C1 (1194) and C3 (1192). The minimum value for LLR at check node C1 is selected from variable nodes V2 and V4 as indicated by solid connecting lines 1194a and 1194b. Similarly, the minimum value for LLR at check node C3 is selected from variable nodes V2 and V4 as indicated by solid connecting lines 1192a and 1192b.

The virtual shortening of the matrices and the message passing methods described in FIG. 11D with the aid of the H matrix 1172 and Tanner graph 1189 are implemented in various embodiments within decoders with shift registers when LDPC and QC-LDPC codes are used.

Figure 12:
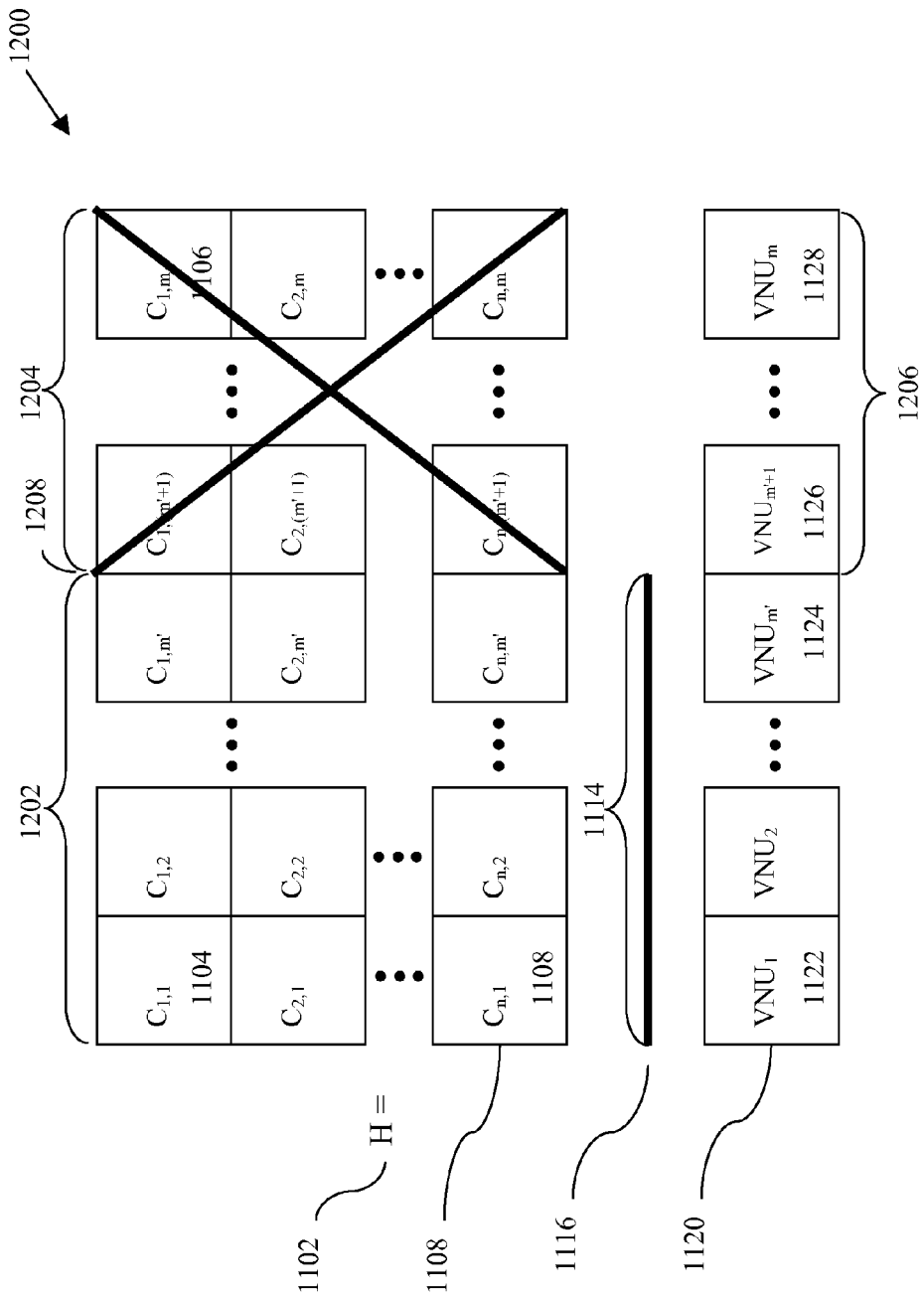
FIG. 12 illustrates another virtual adjustment related to a code-rate change, according to embodiments of the invention.

FIG. 12 illustrates, generally at 1200, another virtual adjustment related to code-rate change, according to embodiments of the invention. With reference to FIG. 12, as described above in conjunction with FIG. 11A and FIG. 11B, when the code-rate is changed, for example decreased, the length of the encoded data is shortened due to a virtual adjustment made to the encode G matrix. Hence, the horizontal extent in bits 1114 of the decoder input 1116 is now less than the horizontal extent of the H matrix 1102. When a structured code such as a quasi-cyclic low density parity check code (QC-LDPC) is used, the H matrix 1102 can be virtually adjusted (shortened in this case) by not using the columns of circulants indicated at 1204. In addition, decoding components that occur in the decoding processes indicated at 1206 are either virtually bypassed or virtually disabled, depending on the implementation. These virtual changes are made consistent with the requirement that the input to the decoding process 1116 has the same number of bits 1114 as the horizontal extent in bits of the decoding components 1122 through 1124, which is indicated at 1202. In various embodiments, a data management module such as data management module 206 sends either a bypass signal or a disable signal to make the virtual adjustments needed in the encoders 208 through 216. The bypass signal provides an end point, such as 1208 in FIG. 12 which indicates the end of the portion of the H matrix 1102 that will be used for decoding. Computations associated with circulants indicated by 1204 are not performed. In an alternative implementation, a disable signal is used to disable the computations associated with circulants 1204 after they have been made. In other embodiments, when a decoder and an encoder are in communication with each other, such as optional communication 224 and 226 in FIG. 2, virtual adjustments to the encoding occur in response to signals sent from the decoder, thereby eliminating the need to engage the data management module with virtual adjustments of the encoding and decoding.

The bypass or disable commands can be provided by logic implemented in hardware or the commands can be issued by firm-ware. A code-rate used to encode data is associated with the encoded data when the encoded data is written to the memory cells. Such association permits the encoded data to be decoded with the same code-rate that was used initially for encoding.

Following the example described with respect to FIG. 10A through FIG. 10C, when the code-rate is changed from 0.94 (1062 in FIG. 10C) to 0.91 (1072 in FIG. 10B) a virtual adjustment is made to reduce the number of circulants from 71 (1064 in FIG. 10C) to 47 (1074 in FIG. 10B). The decoding process proceeds with the virtually shortened H matrix 1102 (FIG. 12). Note that since 24 circulants are not used at the 0.91 code-rate, it is more efficient to use virtual shortening instead of forcing the bits associated with these 24 circulants to a strong LLR value as described above. The process described herein is not limited to a single change of the code-rate and corresponding virtual change to the H matrix 1102, subsequent changes can be made. For example, in one embodiment, the code-rate could be decreased to any code-rate desired from the example of table 1000 (FIG. 10A through FIG. 10C). Alternatively, the code-rate can be changed such that the code-rate is increased instead of decreased. In yet another example, any combination of increases and/or decreases to the code-rate, with corresponding virtual lengthening or shortening of the encode matrix G and the decode matrix H can be made within the teachings presented herein while using the same G and H matrices.

The discussion presented above with respect to FIG. 12 describes a code-rate reduction based on virtually shortening the H matrix and the decoding components according to the dimension of a circulant, i.e., shortening based on a multiple of a circulant's column dimension. For example, virtually shortening by 512 bits in the case of circulants with dimensions 512×512. Virtually shortening can also be accomplished based on partial circulant dimensions.

In one or more embodiments, virtually shortening an encode or a decode matrix is accomplished by virtually shortening based on a width of a processing engine used in a circulant computation. For example, if there are 1024 bits in a row of a circulant and the processing engine processes 128 variable node boundaries at a time, then a circulant can be virtually shortened based on a multiple of the processing engine width of 128 bits. For a 1024 bit row, the shortening dimensions based on the processing engine width are: 128, 256, 512, 640, 768, 896, and 1024 bits.

If it is desired to shorten within the dimension of a processing engine width (128 bits in the example directly above) then this can be done by combining the method described above where strong LLR values are fed to some nodes or guard values are used such that the variable nodes of interest generate benign values and do not change during decoding. Thus, the check node messages received back from these variable nodes are functionally ignored during the decoding computations occurring in the variable node(s) that is being virtually shortened. For example, in one non-limiting embodiment, if the variable node dimension is 128 bits, then the variable node(s) can be virtually shortened such that the active portion that participates in the decoding computation ranges between 1 and 128 bits as desired, which is any fraction of a processing engine width.

Those of skill in the art will realize that a width of a processing engine can be designed to various dimensions and that the processing engine width of 128 bits used above is provided merely for illustration and does not present any limitations to embodiments of the invention. Using the processes described herein a plurality of use cases can be implemented with the same encoding and decoding hardware, i.e., the same integrated circuit, integrated circuit device, or integrated circuit package. The plurality of use cases can be individually implemented or a plurality of use cases can be implemented on-the-fly by adapting a maximum correctable raw bit error rate limit for a memory system.

In various embodiments, in order to achieve certain changes in code-rate, efficiency and flexibility are achieved by combining the strong LLR technique across a fraction of a processing engine width with virtual shortening of one or more circulants and/or processing engine widths. For example, in one embodiment, G and H matrices are of size 4 by 72 circulants, with a circulant size of 64 bits. 512 nodes are processed at a time (8 circulants). If the matrices are shortened to a width of 16 and 24 circulants then code-rates of 16/20 (80%) and 24/28 (85.7%) result respectively. Since the shortening was done using an integer number of processing units, i.e., 16/8=2 processing units and 24/8=3 processing units, it is efficient to use virtual shortening so that all 72 circulants do not have to be processed. However, if the shortening is done to achieve a code-rate in between 80% and 85.7%, for example a shortening of 2.5 processing engine widths, resulting in a code-rate of 20/24 (83.3%), then it is efficient to combine the technique of virtual shortening with forcing some bits to a strong LLR value. In this case, the 72 circulant matrix is virtually shortened to 3 processing engine widths (24 circulants) and then strong LLR values are forced for the last ½ of the third processing engine width which provides the needed 2.5 processing engine widths represented by the code-rate of 20/24 (83.3%).

Figure 13:
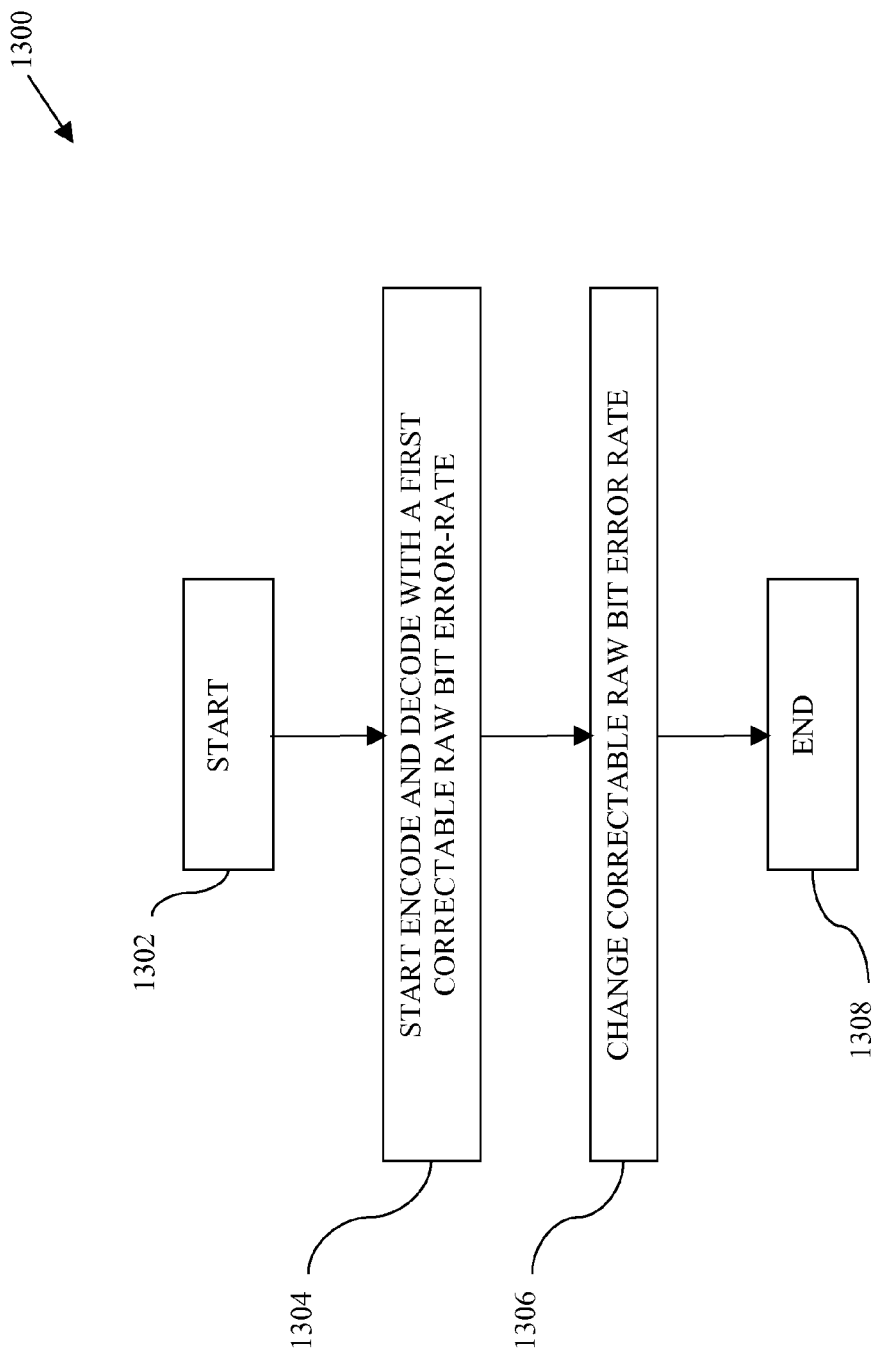
FIG. 13 illustrates a method for dynamically changing a correctable raw bit error rate limit according to embodiments of the invention.

FIG. 13 illustrates, generally at 1300, a method for dynamically changing a correctable raw bit error rate limit according to embodiments of the invention. With respect to FIG. 13, a process starts at a block 1302. At a block 1304 data is encoded, written to memory cells and is then decoded after being read back from the memory cells, where the encoding and the decoding is performed with a first code-rate to obtain a first correctable raw bit error rate limit. As time passes, an actual raw bit error rate occurring in the decoding can increase for various reasons as discussed above, e.g., ageing of the memory cells due to accumulation of program/ease (PE) cycles, adverse environmental conditions e.g., electromagnetic interference, etc. At a block 1306 a change is made to the correctable raw bit error rate limit which results, in one embodiment, in an increase in the correctable raw bit error rate limit of the error correction system to a second correctable raw bit error rate limit. This second correctable raw bit error rate limit is selected for example by memory controller 104 (FIG. 1) or by data management module 206 (FIG. 2) or by an encoder or decoder so that it is sufficiently large to accommodate the actual raw bit error rate occurring during decoding.

The change made at 1306 can be made based on the actual raw bit error rate being corrected in the decoding process. In one or more embodiments, the change is made when the number of corrected bits crosses a threshold value that is lower than the correctable raw bit error rate limit for the code at a given code-rate. It will be noted that the threshold value can be selected to provide sufficient margin such that the code-rate changes before a decoding failure occurs, thereby preventing the need to recover the data with RAID. In various embodiments, the threshold value is provided to the memory system or created by the system in various ways. For example, it can be provided using firm-ware or it can be provided in hardware. In yet other embodiments, it can be calculated and set by the memory system in response to the number of actual raw bit errors being corrected in the decoding process at any point in the life cycle of a memory system. An amount that a threshold value is lower than a correctable raw bit error rate limit for a given code can be established for a given use case as a system design parameter. In other embodiments, the change can be made based on a functional dependency between error rate and PE cycles that was derived from actual measurements or from theoretical calculations. Such a functional relationship can be programmed into the memory system's error correction logic to accommodate anticipated future error correction requirements.

The change made to the correctable raw bit error rate limit at the block 1306 can be made using all of the different techniques described above. For example, in one or more embodiments, the decoding process can be switched from hard-decision decoding to soft-decision decoding, while keeping the code-rate the same, thereby increasing the correctable raw bit error rate limit of the system. In yet other embodiments, the code-rate is changed to produce a change in the correctable raw bit error rate limit of the system. In yet other embodiments, a combination of both techniques are used together.

Changing the code-rate can be accomplished in all of the ways described above. For example, on the decode side an increased code-rate is accommodated by feeding a strong log-likelihood ratio (LLR) for some bits during the decoding process. In other embodiments, a virtual change is made to the decoding matrix during the decoding process. Virtual changes can be made in all of the ways described above, including virtually shortening based on a number of circulants, a processing engine dimension or by combining several techniques. Combination of techniques includes feeding a strong LLR value for some bits and virtually shortening based on a number of circulants for example. On the encode side companion virtual changes are made to correspond with the virtual change(s) made on the decode side in order to accomplish the desired change in the correctable raw bit error rate limit. Thus, in various embodiments, the correctable raw bit error rate limit can be changed on-the-fly. In some embodiments, the code-rate of the error correction system for a memory system can be changed on-the-fly. Changes in code-rate can be made on a chunk basis (code word), a page basis, or on a multiple page basis. Thus, in some embodiments, two or more chunks of encoded data can be stored on a single page of memory cells, where each chunk of data was encoded at a different code-rate. Alternatively, or in conjunction with the foregoing, one or more pages of memory cells can contain chunks of encoded data that were encoded at the same code-rate. Such functionality enables a memory system to be used in a variety of use cases using the same hardware and without need for redesign.

Figure 14:
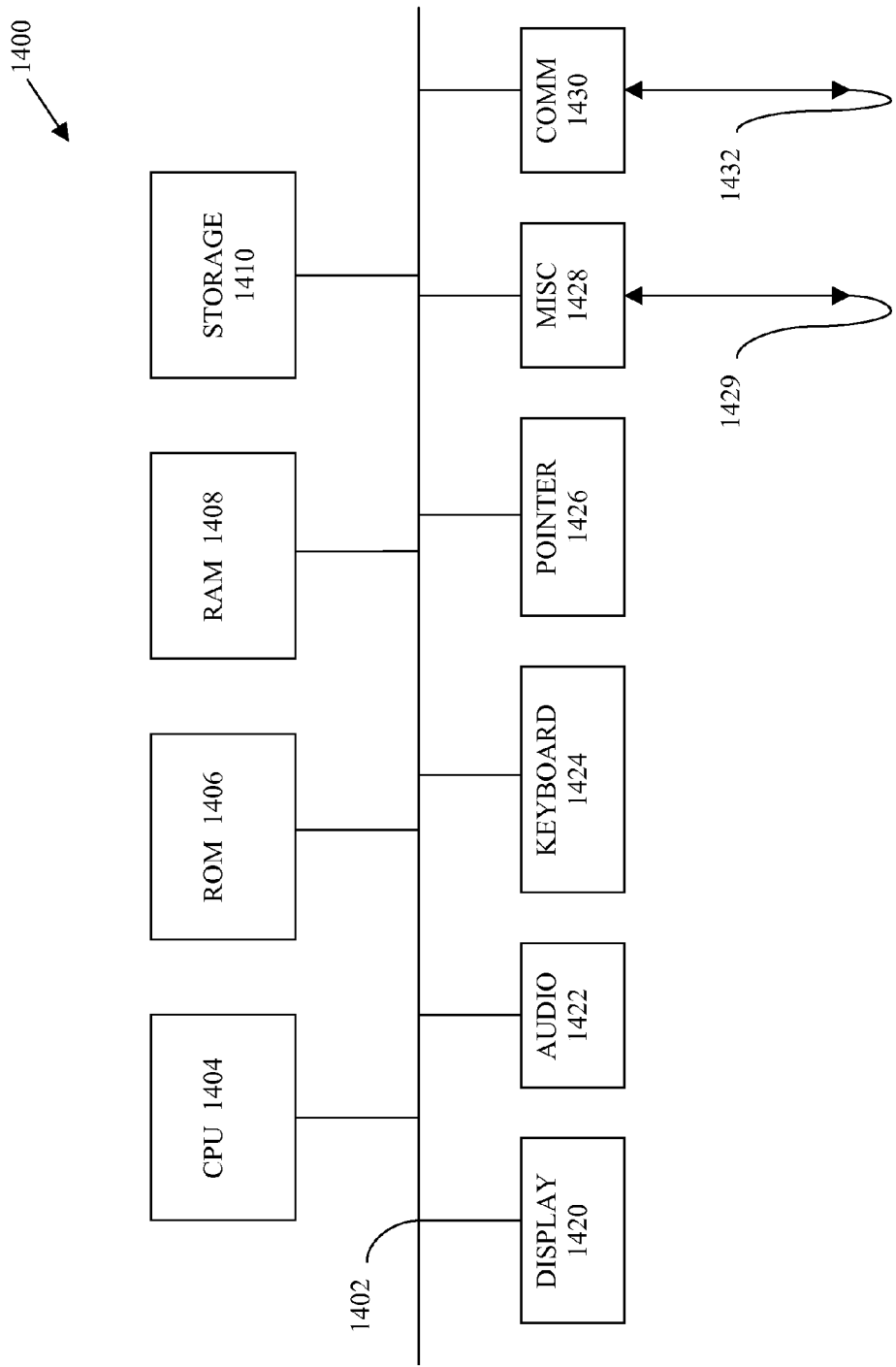
FIG. 14 illustrates a block diagram of a computer system (data processing device such as a computer, smart phone, tablet computer, etc.) in which embodiments of the invention may be used.

FIG. 14 illustrates a block diagram of an embodiment of a host processor, which can be referred to as a computer system (data processing device such as a computer, smart phone, tablet computer, etc.) in which embodiments of the invention may be used. The block diagram is a high level conceptual representation and may be implemented in a variety of ways and by various architectures. Bus system 1402 interconnects a Central Processing Unit (CPU) 1404, Read Only Memory (ROM) 1406, Random Access Memory (RAM) 1408, storage 1410, display 1420, audio, 1422, keyboard 1424, pointer 1426, miscellaneous input/output (I/O) devices 1428, and communications 1430. The bus system 1402 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1494 (FireWire), Universal Serial Bus (USB), etc. The CPU 1404 may be a single, multiple, or even a distributed computing resource. Storage 1410 may be Compact Disc (CD), Digital Versatile Disk (DVD), hard disks (HD), solid state disk (SSD), optical disks, tape, flash, memory sticks, video recorders, etc. Storage 1410 or RAM 1408 might be, for example, an embodiment of the present invention. Note that depending upon the actual implementation of a computer system, the computer system may include some, all, more, or a rearrangement of components in the block diagram. Thus, many variations on the system of FIG. 14 are possible.

Connection with a network is obtained with 1432 via 1430, as is recognized by those of skill in the art, which enables the data processing device 1400 to communicate with devices in remote locations. 1432 and 1430 flexibly represent communication elements in various implementations, and can represent various forms of telemetry, GPRS, Internet, and combinations thereof.

In various embodiments, a pointing device such as a stylus is used in conjunction with a touch screen, for example, via 1429 and 1428.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROMs), electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods herein may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described, but can be practiced with modification and alteration within the spirit and scope of the appended claims. The description is thus to be regarded as illustrative instead of limiting.

What is claimed is:

1. An integrated circuit device for correcting errors in data read from memory cells, comprising:
    an encoder, the encoder is configured from a single parity check matrix; the encoder is configured to be virtually adjustable by setting a number of bits in the encoder to zero; and
    a decoder, the decoder is configured from the single parity check matrix; the decoder is configured to be virtually adjustable by setting a log-likelihood ratio (LLR) for a number of bits in the decoder to a strong value, wherein a code-rate that the encoder and decoder uses is changed by adjusting the number of bits in the encoder that are set to zero and the number of bits in the decoder that are set to the strong LLR value.

2. The integrated circuit device of claim 1, further comprising:
    a data management module, the data management module is connected with the decoder and the encoder, the data management module is configured to select a correctable raw bit error rate limit from a plurality of raw bit error rate limits by changing the code-rate.

3. The integrated circuit device of claim 1, further comprising:
    a communication link, the communication link connects the encoder and the decoder, wherein information on a number of errors occurring during decode cause a code-rate adjustment.

4. The integrated circuit device of claim 1, wherein the strong LLR value for the bits set in the decoder is selected from the group consisting of a value that is strongly resistant to change, a value that is fixed during the decoding, and a guard value.

5. The integrated circuit device of claim 2, wherein the number of bits set to zero in the encoder is selected from the group consisting of a fraction of a processing engine width and a multiple of a processing engine width.

6. The integrated circuit device of claim 2, wherein the number of bits set to a strong LLR value in the decoder is selected from the group consisting of a fraction of a processing engine width and a multiple of a processing engine width.

7. The integrated circuit device of claim 2, wherein a code used to develop the single parity check matrix is selected from the group consisting of a user specified error correcting code, a Reed-Solomon code, a Bose-Chaudhuri-Hochquenghem (BCH) code, a quasi-cyclic low density parity check code (QC-LDPC), an irregular repeat-accumulate (IRA) code, a code from projective geometry, and a user defined quasi-cyclic code.

8. The integrated circuit device of claim 1, wherein a memory cell is selected from the group consisting of NAND, NOR, user defined.

9. The integrated circuit device of claim 8, wherein the memory cell is selected from the group consisting of a single-level cell, a triple-level cell, and a multi-level cell.

10. The integrated circuit device of claim 2, wherein the code-rate is changed when a number of bits corrected by the decoder crosses a threshold and the threshold is less than the correctable raw bit error rate limit.

11. The integrated circuit device of claim 10, wherein the threshold prevents a potential decoding failure by maintaining the number of bits corrected by the decoder at a level below the correctable raw bit error rate limit.

12. The integrated circuit device of claim 2, further comprising;
    a RAID architecture, the RAID architecture is used to recover data if the data fails to decode successfully.

13. A method for correcting errors in data read from memory cells, comprising:
    making a virtual adjustment to an encoder, wherein the encoder is configured from a single low density parity check (LDPC) matrix, the making sets a number of bits in the encoder to zero; and
    encoding data while using the number of bits set to zero to virtually reduce a dimension of the encoder, wherein a code-rate is established; and
    decoding the encoded data at a decoder configured from the single parity check matrix, wherein a code-rate that the encoder and decoder uses is changed by adjusting the number of bits in the encoder that are set to zero and the number of bits in the decoder that are set to a strong log-likelihood ratio (LLR) value.

14. The method of claim 13, further comprising:
    receiving a command to change the code-rate from a first code-rate to a second code-rate, wherein data is encoded at the second code-rate in response to the receiving.

15. The method of claim 14, wherein the command to change the code-rate is based on information that occurred during a previous decode operation performed by a decoder.

16. The method of claim 15, wherein information further comprises:

a number of bits corrected during the previous decode operation.

17. The method of claim 13, wherein the code-rate is changed when a number of bits corrected by a decoder crosses a threshold and the threshold is less than a correctable raw bit error rate limit of the code-rate.

18. The method of claim 17, wherein the threshold prevents a potential decoding failure by maintaining the number of bits corrected by the decoder at a level below the correctable raw bit error rate limit.

19. The method of claim 13, further comprising;
using a RAID function to recover data following a decode failure.

20. A method for correcting errors in data read from memory cells, comprising:
making a virtual adjustment to a decoder, the decoder is configured from a single parity check matrix, wherein the making assigns a strong log-likelihood ratio (LLR) value to a number of bits in the decoder; and
decoding data while using the strong LLR value for the number of bits, wherein the strong LLR value changes a code-rate used during the decoding by virtually adjusting a column dimension of the single parity check matrix.

21. The method of claim 20, further comprising:
sending a command to change a code-rate used to encode data from a first code-rate to a second code-rate, wherein data is encoded at the second code-rate in response to the sending.

22. The method of claim 21, wherein the command to change code-rate is based on information that occurred during the decoding.

23. The method of claim 22, wherein information further comprises:
a number of bits corrected during the decoding.

24. The method of claim 20, wherein the strong LLR value is selected from the group consisting of a value that is strongly resistant to change, a value that is fixed during the decoding, and a guard value.

25. The integrated circuit device of claim 1, wherein a code used to develop the single parity check matrix is a low density parity check (LDPC) code.

26. The method of claim 13, wherein the code used to develop the LDPC matrix is a quasi-cyclic LDPC code.

27. The method of claim 20, wherein a code used to develop the single parity check matrix is a low density parity check code (LDPC).

* * * * *